(12) United States Patent
Abe

(10) Patent No.: US 6,437,562 B2
(45) Date of Patent: Aug. 20, 2002

(54) MAGNETIC FIELD CHARACTERISTICS EVALUATION APPARATUS AND MAGNETIC FIELD CHARACTERISTICS MEASURING METHOD

(75) Inventor: Masayuki Abe, Fuchu (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/800,744

(22) Filed: Mar. 8, 2001

(30) Foreign Application Priority Data

Mar. 27, 2000 (JP) .......................................... 2000-087655
Mar. 27, 2000 (JP) .......................................... 2000-087656

(51) Int. Cl.$^7$ ............................................... G01R 33/12

(52) U.S. Cl. ......................... 324/210; 324/244; 73/105; 250/306

(58) Field of Search ......................... 324/210–211, 212, 324/244–244.1, 259, 260, 261, 262; 73/105, 1.89; 250/306–307; 360/31

(56) References Cited

U.S. PATENT DOCUMENTS

| 5,412,980 A | 5/1995 | Elings et al. ............... 73/105 |
| 5,519,212 A | 5/1996 | Elings et al. ............... 250/234 |
| 5,652,377 A | * 7/1997 | Yagi ............................... 73/105 |
| 5,898,106 A | * 4/1999 | Babcock et al. ............. 73/1.89 |

* cited by examiner

Primary Examiner—Jay Patidar
(74) Attorney, Agent, or Firm—Pillsbury Winthrop LLP

(57) ABSTRACT

There is disclosed a magnetic field characteristics evaluation apparatus for turning off a switching signal, measuring the surface of a magnetic field generating member in a magnetized state by AFM, and storing AFM signal together with a position signal corresponding to a scanning position in a memory to display a surface configuration based on the AFM signal. Subsequently, the switching signal is turned on, the magnetic head is set to a magnetized state, the AFM signal is referred to, the magnetic head surface is measured by MFM, and MFM signal together with the position signal corresponding to the scanning position are stored in the memory to display a surface magnetic field distribution based on the MFM signal. Therefore, it is possible to accurately specify, from the surface, a position in which the magnetic field is generated.

15 Claims, 13 Drawing Sheets

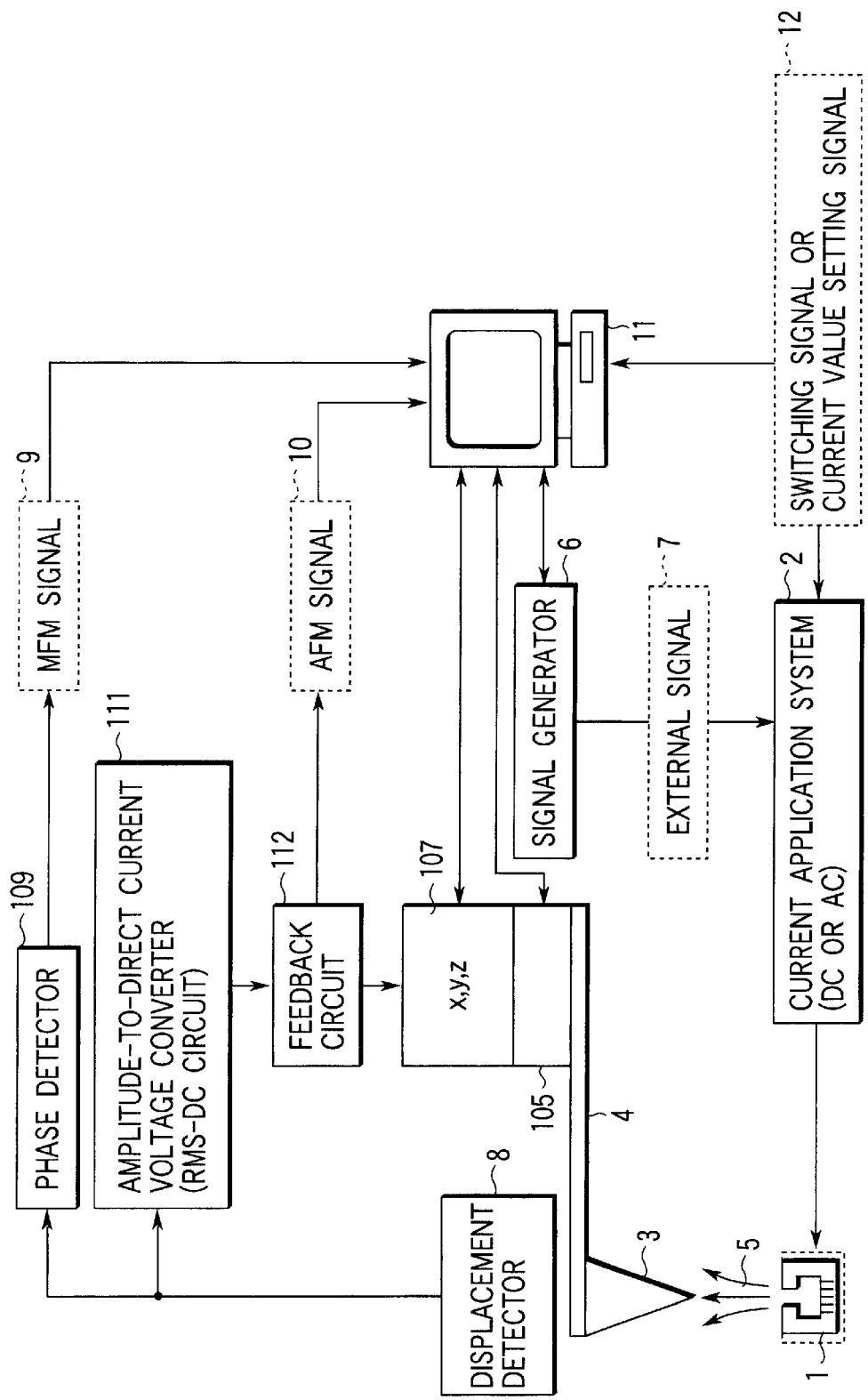
F I G. 3

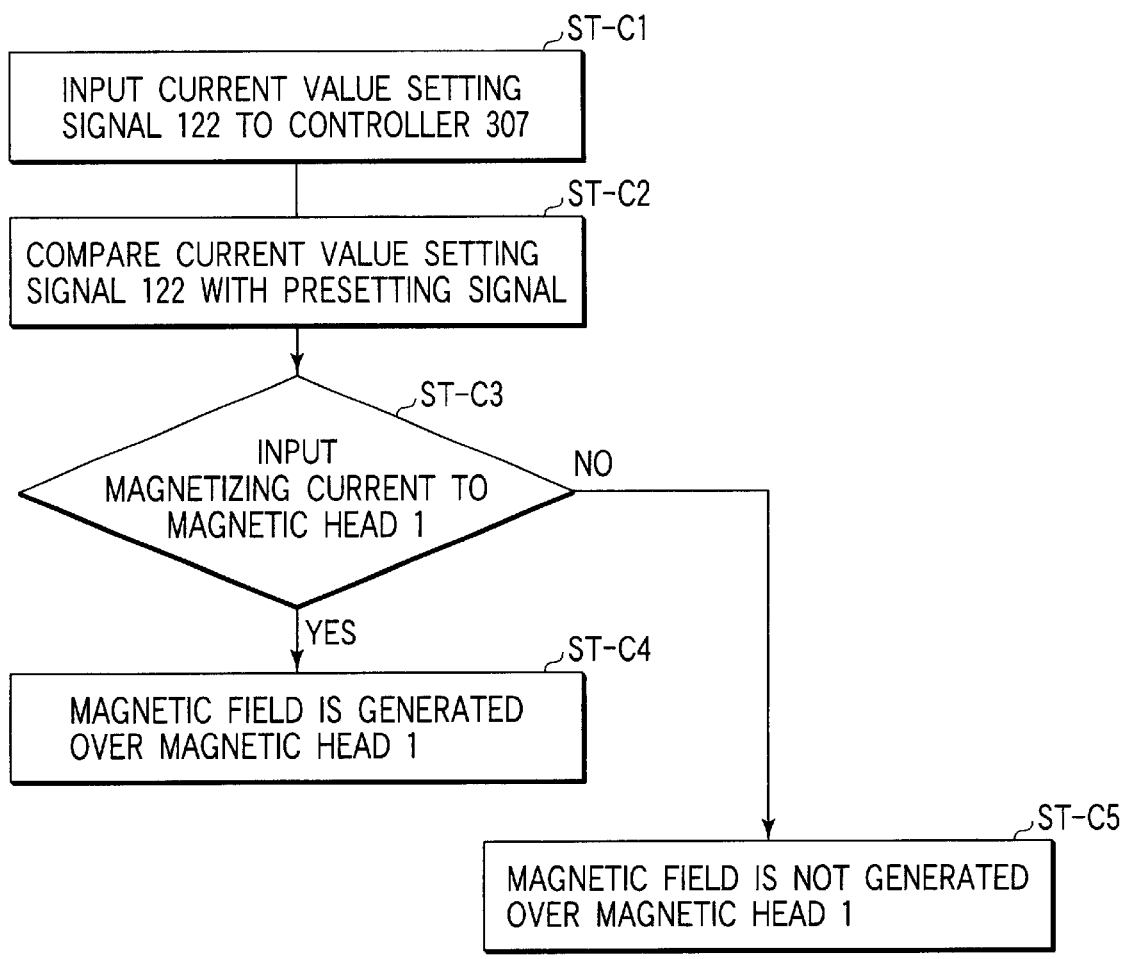
F I G. 8

| | NORMAL HEAD | DEFECTIVE HEAD |
|---|---|---|
| I=20mA | | 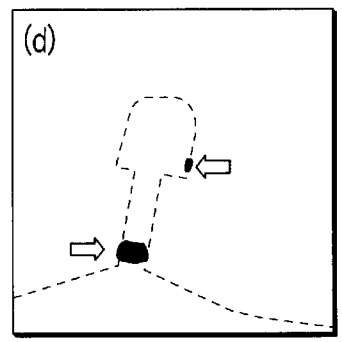 (d) |
| I=30mA | 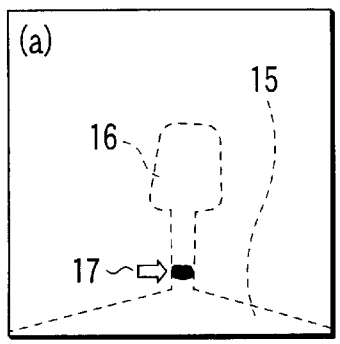 (a) 15, 16, 17 | 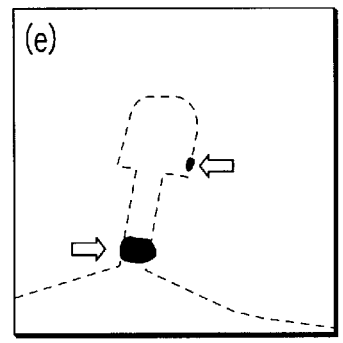 (e) |
| I=40mA | 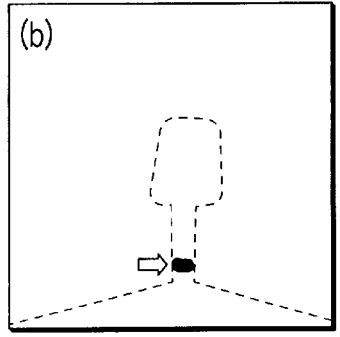 (b) | 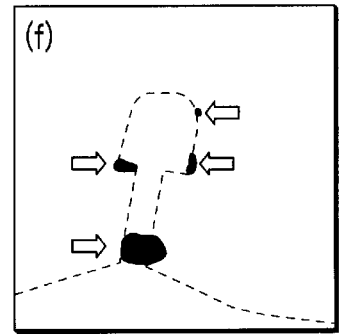 (f) |
| I=45mA | 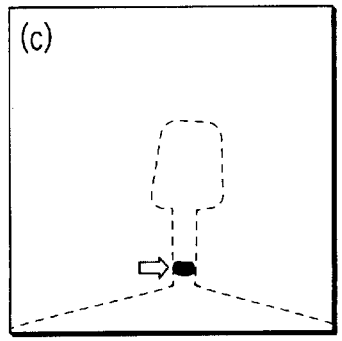 (c) | |
⇐ LEAK MAGNETIC FIELD GENERATING PLACE
---- HEAD OUTLINE
FIG. 14

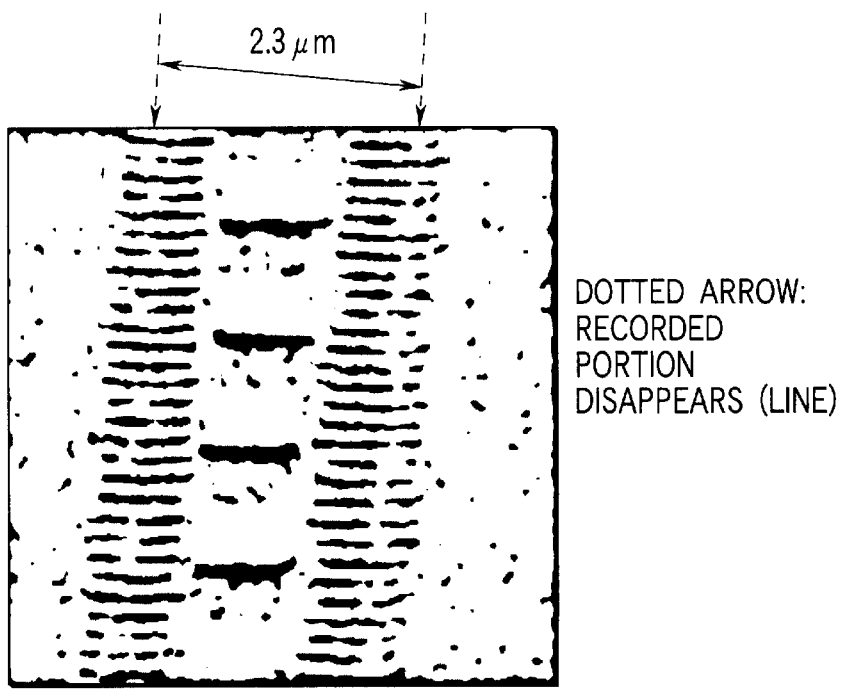
FIG. 15A  MFM IMAGE (SCANNED RANGE 5μm×5μm)
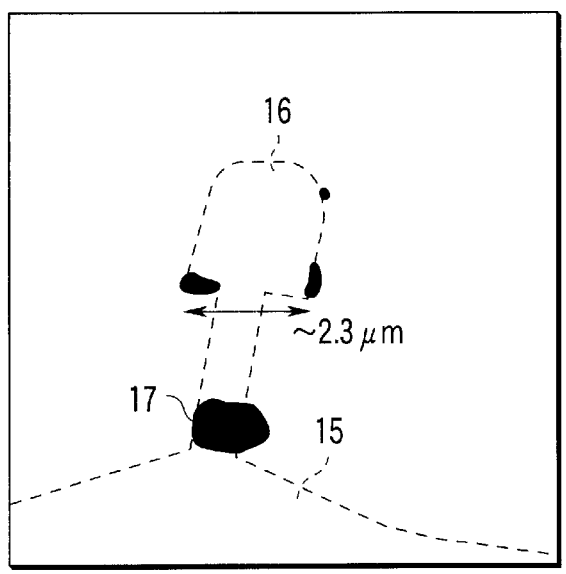
FIG. 15B  HEAD IMAGE (SCANNED RANGE 10μm×10μm)

MAGNETIC FIELD CHARACTERISTICS EVALUATION APPARATUS AND MAGNETIC FIELD CHARACTERISTICS MEASURING METHOD

CROSS-REFERENCE TO RELATED APPLICATIONS

This application is based upon and claims the benefit of priority from the prior Japanese Patent Applications No. 2000-087655, filed Mar. 27, 2000; and No. 2000-087656, filed Mar. 27, 2000, the entire contents of both of which are incorporated herein by reference.

BACKGROUND OF THE INVENTION

The present invention relates to a magnetic field characteristics evaluation apparatus for evaluating a device for generating a magnetic field, and a measuring method for evaluating the device for generating the magnetic field. More particularly, it relates to a magnetic field characteristic evaluation apparatus for specifying a portion for generating a magnetic field of a magnetic head as the device for generating the magnetic field, and a measuring method for specifying the portion for generating the magnetic field.

As a well-known device for generating a magnetic field, a magnetic head is exemplified. The magnetic head is used, for example, in a hard disk drive to magnetically write data into a magnetic disk which rotates as a magnetic recording medium, and to magnetically read data from the magnetic disk. The magnetic head is provided, in its structure, with a magnetic gap as magnetic flux generating portion for generating a reproducing or recording magnetic flux. The magnetic head is usually designed or manufactured in such a manner that the magnetic flux is generated only from the magnetic gap. In some cases, owing to a deficiency in a manufacturing process or a design problem, there is a possibility that a leak magnetic flux is generated from an undesired place other than the magnetic gap. With the miniaturization of the magnetic head, the hard disk drive is structured such that the magnetic head is floatingly disposed above the magnetic disk rotating in a further micro gap. In this hard disk drive, there is a problem that not only the normal magnetic flux from the magnetic gap but also the leak magnetic flux from the undesired place writes data into the magnetic disk, or deletes or rewrites original data. This problem is found out after the magnetic head is incorporated into the hard disk drive, and at this point of time it is evaluated that the magnetic head is a defective product.

With regard to conventional evaluation of the magnetic head, the magnetic head is incorporated into the hard disk drive, and steps for writing and reproducing the data are then implemented. At this time, it is judged or evaluated whether or not the magnetic head is defective. Instead of such a judging or evaluating method, there has been a demand for an apparatus and a method in which even in the case of a miniaturized magnetic head, magnetic recording head characteristics can be evaluated by its surface analysis with a high sensitivity and a high resolution.

BRIEF SUMMARY OF THE INVENTION

An object of the present invention is to provide a magnetic field characteristics evaluation apparatus and a magnetic field characteristics measuring method that can accurately measure a surface configuration (in a word, topography) of a device for generating a magnetic field, and exactly specify a magnetic field generating portion of the magnetic field generating device.

According to the present invention, there is provided a magnetic field characteristics evaluation apparatus having the following characteristic constitution.

The constitution comprises: a setting device configured to selectively set a magnetic field generating member in one of a magnetized state in which a magnetic flux is generated and a non-magnetized state in which no magnetic flux is generated;
  a probe, at least partially formed of magnetic material, configured to sense the magnetic field generating member during vibration of the probe;
  a displacement detector configured to scan the magnetic field generating member with the probe vibrated and detect a first displacement of the probe in the non-magnetized state and a second displacement of the probe in the magnetized state;
  a surface profile measuring circuit configured to measure a surface profile of the magnetic field generating member in the non-magnetized state based on the detected first displacement; and
  a magnetic distribution measuring circuit configured to separate the probe from the magnetic field generating member in the magnetized state by a constant distance based on the surface profile measured by the surface profile measuring circuit, and measure a magnetic distribution of the magnetic field generating member based on the detected second displacement.

Moreover, to achieve the objects, according to the present invention, there is provided a magnetic field characteristics evaluation apparatus having the following characteristic constitution.

The constitution comprises: a setting device configured to selectively set a magnetic field generating member in one of a magnetized state in which a magnetic flux is generated and a non-magnetized state in which no magnetic flux is generated;
  a probe, at least partially formed of magnetic material, configured to sense the magnetic field generating member during vibration of the probe;
  a displacement detector configured to scan the magnetic field generating member with the probe vibrated and detect a first displacement of the probe in the non-magnetized state and a second displacement of the probe in the magnetized state;
  a surface profile measuring circuit configured to measure two surface profiles of the magnetic field generating member in corresponding to the non-magnetized state and the magnetized state based on the detected first displacement and second displacement respectively; and
  calculating circuit configured to calculate a difference between the surface profile based on the detected first displacement and the surface profile based on the detected second displacement.

Furthermore, to achieve the aforementioned objects, according to the present invention, there is provided a magnetic field characteristics measuring method having the following characteristic constitution.

The magnetic field characteristics measuring method comprises: setting a non-magnetized state in which no magnetic flux is generated from a magnetic field generating member;
  scanning the magnetic field generating member with a probe, at least partially formed of magnetic material, that senses the magnetic field generating member during vibration of the probe;

detecting a first displacement of the probe;

measuring a surface profile of the magnetic field generating member in the non-magnetized state based on the detected first displacement;

setting a magnetized state in which the magnetic flux is generated from the magnetic field generating member;

separating the probe from the magnetic field generating member in the magnetized state by a constant distance based on the surface profile;

scanning the magnetic field generating member with the probe vibrated;

detecting a second displacement of the probe; and measuring a magnetic distribution of the magnetic field generating member based on the detected second displacement.

Moreover, to achieve the objects, according to the present invention, there is provided a magnetic field characteristics measuring method having the following characteristic constitution.

The magnetic field characteristics measuring method comprises: setting a non-magnetized state in which no magnetic flux is generated from a magnetic field generating member;

scanning the magnetic field generating member with a probe, at least partially formed of magnetic material, that senses the magnetic field generating member during vibration of the probe;

detecting a first displacement of the probe;

measuring a first surface profile of the magnetic field generating member in the non-magnetized state based on the detected first displacement;

setting a magnetized state in which the magnetic flux is generated from the magnetic field generating member;

scanning the magnetic field generating member with the probe vibrated;

detecting a second displacement of the probe; and measuring a second surface profile of the magnetic field generating member in the magnetized state based on the detected second displacement; and calculating a difference between the first surface profile and the second surface profile.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a detailed functional block diagram of FIG. 2;

FIG. 7 is a functional block diagram in a current application system in the second embodiment of the present invention;

FIG. 8 is a flow chart showing flow that a magnetic field over the magnetic head shown in FIG. 7 is generated based on comparison between a current value setting signal and a presetting signal in controller of the second embodiment of the present invention;

FIG. 14 is a diagram showing a place in which a leak magnetic field is generated from the magnetic head shown in FIG. 12;

FIG. 15A is a diagram showing a recording medium magnetic field distribution recorded using the magnetic head shown in FIG. 15B, and FIG. 15B is a diagram showing the place in which the leak magnetic field is generated over the magnetic head shown in FIG. 12.

DETAILED DESCRIPTION OF THE INVENTION

An embodiment of a magnetic field characteristics evaluation apparatus and a magnetic field characteristics measuring method of the present invention will be described hereinafter with reference to the accompanying drawings.

Prior to description of the embodiment of the magnetic field characteristics evaluation apparatus according to the embodiment of the present invention, a principle of the apparatus will be described.

In the present embodiment, the surface of a magnetic field generating member with a magnetic field generated therein, such as a magnetic head, is scanned by an AFM to measure a surface configuration of the magnetic field generating member. Moreover, the surface of the magnetic field generating member with the magnetic field generated therein, such as the magnetic head, is scanned by an MFM to specify a portion that has intense magnetic field such as magnetic field leakage. Here, the AFM is an apparatus for using a probe to scan the surface of the magnetic field generating member and measure the surface configuration of the magnetic field generating member. In the measurement by the AFM, since the probe scans the surface configuration along irregularities, the AFM signal indicating the surface configuration of the magnetic field generating member can be obtained. The MFM is an apparatus for scanning the surface of the magnetic field generating member with the probe formed of magnetic material to measure a magnetic field distribution of the magnetic field generating member. In the measurement by the MFM, mainly used is a method of scanning the surface configuration in a position apart from the surface configuration at a constant distance between the probe and the surface, and obtaining an MFM signal indicating a magnetic field intensity of the position based on the surface configuration obtained by the measurement using the AFM.

In order to obtain the AFM and MFM signals by one probe, it is necessary to use a probe that contains the magnetic material.

Figure 1:
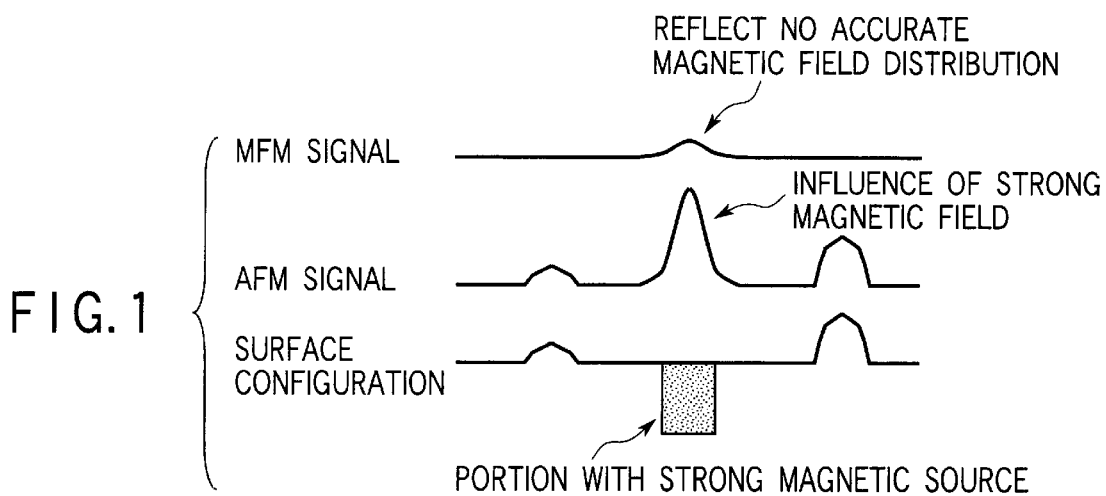
FIG. 1 shows respective waveform diagrams of a surface configuration with irregularities having a portion whose magnetic field is strong in a specific position, an atomic force microscope (hereinafter abbreviated as AFM) signal indicating an output surface configuration as a result of measurement of the surface configuration with a conventional magnetic field characteristics evaluation apparatus, and a magnetic force microscope (hereinafter abbreviated as MFM) signal indicating a surface magnetic field distribution based on the AFM signal.

As shown in FIG. 1, in case the probe is formed of the magnetic material, the probe scans the position of the magnetic field generating member where the magnetic field exists. Then, even when a neighborhood of the position with the magnetic field present therein is flat, the AFM reacts with the magnetic field, the AFM signal has a peak in the neighborhood of the position where the magnetic field exists. Therefore, the surface configuration of the magnetic head cannot accurately be measured. In case the surface configuration cannot accurately be measured in this manner, the MFM cannot operate while keeping the constant distance from the magnetic head surface, and the MFM signal cannot reflect an accurate magnetic field distribution.

In the embodiment of the present invention, in case a current flowing through the magnetic head is turned on or off to generate or eliminate the magnetic field over the magnetic head, the surface configuration and accurate magnetic field distribution of the magnetic head can be measured. That is to say, first while no current is applied to the magnetic head and the magnetic field of the magnetic head disappears, the probe is allowed to scan the magnetic field generating member and an almost real AFM signal that indicates the surface configuration of the magnetic head is measured. The AFM signal measured while the magnetic head is in the non-magnetized state is stored in a memory. Since the AFM signal measured in the non-magnetized state of the magnetic head undergoes no influence of the magnetic field, the surface configuration of the magnetic head can accurately be measured. Subsequently, in the case of applying a current to the magnetic head to generate the magnetic field in the magnetic head, the probe is allowed to scan the magnetic field generating member and the MFM signal is measured. In case the MFM signal is measured, the magnetic field generating member is scanned by the probe while the accurate surface configuration of the magnetic head obtained by the AFM signal measured in the non-magnetized state of the magnetic head is referred to from the memory. As a result, since the probe can be operated at the constant distance from the magnetic head surface in the measurement by the MFM, it is possible to measure the accurate magnetic field distribution of the magnetic head.

Figure 2:
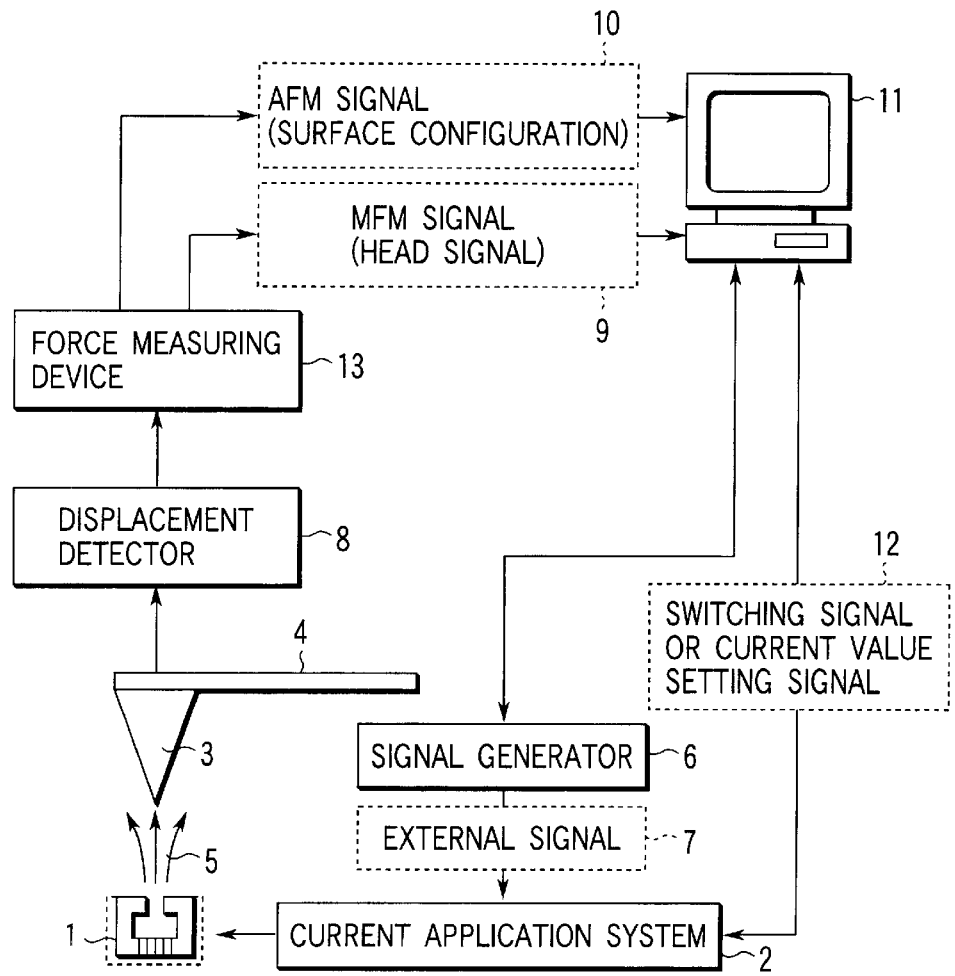
FIG. 2 is a functional block diagram of a magnetic field characteristics evaluation apparatus including a magnetic head as a magnetic field generating member according to a first embodiment of the present invention.

A concrete example of the magnetic field characteristics evaluation apparatus and magnetic field characteristics measuring method according to the first embodiment of the present invention will be described with reference to FIGS. 2 to 5. FIG. 2 is a block diagram of the characteristics evaluation apparatus including a magnetic head 1 as a magnetic field generating member.

The magnetic field characteristics evaluation apparatus shown in FIG. 2 is provided with a probe 3 for scanning the surface of the magnetic head 1, the surface of the probe 3 being coated with magnetic material or including magnetic material, and a cantilever 4 on one end of which the probe 3 is supported. In order to vibrate the cantilever 4, a vibrating element (not shown) of a force measuring device 13 is disposed on the other end of a cantilever 4. The magnetic head 1 is connected to a current application system 2 for supplying a magnetizing current of a direct current (hereinafter referred to as DC) or an alternating current (hereinafter referred to as AC) to the magnetic head 1. A signal generator 6 for outputting an external signal 7 that sets the magnetizing current is connected to a signal processor 11. Moreover, the signal processor 11 outputs a current setting signal for setting the magnetizing current to the signal generator 6, and outputs a switching signal 12 for turning on or off the magnetizing current or a current value setting signal 12 for setting a magnetizing current value to the current application system 2. The magnetic field characteristics evaluation apparatus shown in FIG. 2 is further provided with a displacement detector 8 for detecting a displacement of the probe 3, that is, the displacement of a tip end of the cantilever 4. An amplitude signal from this displacement detector 8 is processed by the force measuring device 13, and supplied, to the signal processor 11, as the AFM signal indicating the surface configuration of the magnetic head and the MFM signal indicating the magnetic field distribution of the magnetic head 1.

The current application system 2 is a circuit for applying, to the magnetic head 1, the current adjusted to indicate a predetermined value to generate the magnetic field from the magnetic head 1. Here, the current passed through the magnetic head 1 may be a DC, an AC, or an AC and DC. The probe 3 is coated and magnetized with the magnetic material. This probe 3 measures the surface configuration and surface magnetic field of the magnetic head 1 as the magnetic field generating member. Additionally, the probe 3 is not limited to the probe coated with the magnetic material or including the magnetic material, and the probe itself may be formed of the magnetic material or including the magnetic material, or a part of the probe may be formed of the magnetic material. The cantilever 4 is connected to the probe 3 on one end thereof, and has a mechanical resonance frequency $\omega_r$.

The signal generator 6 inputs, to the current application system 2, the external signal for controlling the amplitude, phase, and frequency of the magnetizing current output from the current application system 2.

The displacement detector 8 is disposed in the vicinity of the cantilever 4 to detect a displacement of the cantilever 4, and outputs the displacement as an amplitude signal indicating the amplitude. The displacement detector 8 is usually provided with a laser light source and a divided photodiode, and inputs a reflected light of laser light to the divided photodiode for detecting the displacement. Alternatively, the displacement detector 8 may be provided with the laser light source and an optical fiber, and detect the displacement by interference of the laser light.

The force measuring device 13 converts the amplitude signal from the displacement detector 8 into an MFM signal 9 (signal having information on the magnetic field distribution in the vicinity of the magnetic head 1) and an AFM signal 10 (signal having information on the surface configuration of the magnetic head 1), and outputs the MFM signal 9 and the AFM signal 10. The MFM signal 9 is measured by detecting the phase from the amplitude signal. Moreover, the force measuring device 13 vibrates the cantilever 4 at a desired frequency to three-dimensionally move the cantilever 4.

The signal processor 11 detects the value of the current flowing through the magnetic head 1 from the current application system 2, and outputs, to the current application system 2, the current value setting signal 12 for adjusting a magnitude of the magnetizing current value passed through the magnetic head 1 or the switching signal 12 for flowing or not the magnetizing current through the magnetic head 1. Thereby, the magnetizing current is controlled. Moreover, the signal processor 11 outputs the current value setting signal to the signal generator 6, so that in case the external signal for setting the amplitude, phase, and frequency of the magnetizing current is input to the current application system 2 through the signal generator 6, the desired magnetizing current flows through the magnetic head 1. Furthermore, the signals (MFM signal 9 and AFM signal 10) indicating the surface magnetic field and surface configuration of the magnetic head 1 as the magnetic field generating member are input via the force measuring device 13 to the signal processor 11. Additionally, the signal processor 11 has a function of: storing the current value signal indicating the current value (amplitude, phase, and frequency of the current) flowing through the magnetic head 1, and the AFM and MFM signals indicating the surface configuration and surface magnetic field of the magnetic head 1 as the magnetic field generating member; processing these signals; generating an image signal; and displaying an image of the magnetic head 1.

Moreover, as shown in FIG. 3, the force measuring device 13 shown in FIG. 2 is a vibrating piezoelectric element 105 which is disposed on the other end of the cantilever 4 to support the cantilever 4. A frequency setting signal for vibrating the vibrating piezoelectric element 105 is applied to the vibrating piezoelectric element 105 from the signal processor 11. The vibrating piezoelectric element 105 is supported by a scanning piezoelectric element 107. In case a scanning signal is input to the scanning piezoelectric element 107 from the signal processor 11, the scanning piezoelectric element 107 is distorted in a three-dimensional direction (x, y and z directions). As a result, the cantilever 4 supported by the scanning piezoelectric element 107 is displaced in the three-dimensional direction, so that the probe 3 can scan the surface of the magnetic head 1. Moreover, the amplitude signal from the displacement detector 8 is supplied to an amplitude-to-direct current voltage converter 111. In the amplitude-to-direct current voltage converter 111, the amplitude signal is converted to a direct-current voltage signal, and the direct-current voltage signal is supplied to a feedback circuit 112, and a feedback signal in the feedback circuit 112 is generated based on the amplitude signal converted to the direct-current voltage signal. The feedback signal is supplied to the scanning piezoelectric element 107, and supplied as the AFM signal to the signal processor 11. Moreover, the amplitude signal from the displacement detector 8 is output to a phase detector 109. In the phase detector 109, the amplitude signal is converted to the MFM signal, and supplied to the signal processor 11. Additionally, the scanning piezoelectric element 107 supports the vibrating piezoelectric element 105, but as other case the scanning piezoelectric element 107 may be disposed in a position for supporting the magnetic head 1. That is to say, the scanning piezoelectric element 107 may be disposed so that a relative position of the magnetic head 1 and probe 3 can be adjusted.

The vibrating piezoelectric element 105 is attached to an end portion being different from the tip end of the cantilever 4 to which the probe 3 is attached. The vibrating piezoelectric element 105 vibrates the cantilever 4 at the desired frequency.

The scanning piezoelectric element 107 is disposed on the vibrating piezoelectric element 105 to three-dimensionally move the cantilever 4 and adjust the relative position of the magnetic head 1 and probe 3 to a desired position. That is to say, the cantilever 4 is moved by a predetermined amount on a plane parallel to the surface of the magnetic head 1 facing the probe 3, and a plane parallel to a plane vertical to the surface of the magnetic head 1 to adjust the relative position of the magnetic head 1 and the probe 3.

The amplitude-to-direct current voltage converter 111 is a circuit for converting the amplitude signal supplied from the displacement detector 8 to the direct-current voltage signal. The direct-current voltage signal corresponding to the amplitude of the cantilever 4 is generated from the amplitude-to-direct current voltage converter 111. This direct-current voltage signal is input to the feedback circuit 112. The feedback circuit 112 generates the feedback signal for suppressing an amplitude fluctuation to set the amplitude to be constant. This feedback signal is supplied to the scanning piezoelectric element 107, and further supplied as the AFM signal to the signal processor 11.

The phase detector 109 detects the phase of the amplitude signal output from the displacement detector 8, and outputs, to the signal processor 11, the MFM signal indicating the magnetic field distribution in the vicinity of the magnetic head 1 by the MFM. Additionally, in case the magnetic field is generated by the AC, a synchronous wave detector (not shown) is disposed in the vicinity of an output end of the phase detector 109.

Figure 4:
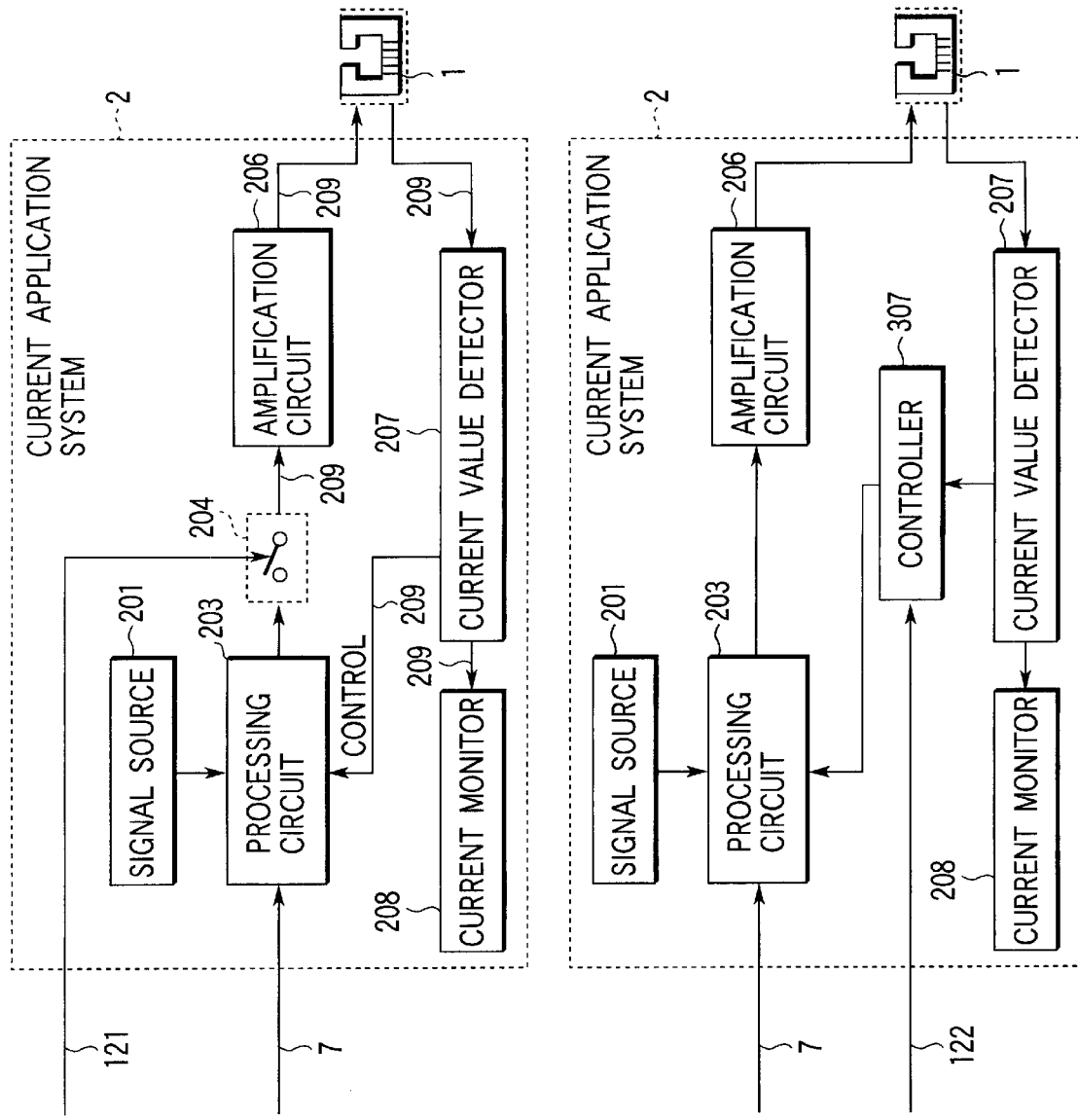
FIG. 4 is a functional block diagram in a current application system shown in FIG. 2 or 3.

In the present embodiment, as shown in FIG. 4, the current application system 2 is provided with: a signal source 201 for generating a certain constant frequency signal to apply the current to the magnetic head 1; and a processing circuit 203 to which the frequency signal, the external signal 7, and a current value control signal for controlling a current value are input. The processing circuit 203 adds or modulates (amplitude modulation, phase modulation, frequency modulation) these signals, and outputs such processed signals to a switch 204. A switching signal 121 for turning on or off the switch 204 is input to the switch 204 for controlling whether or not the processed signal is output to an amplification circuit 206. In the amplification circuit 206, the processed signal is amplified, and applied as the magnetizing current to the magnetic head 1. The magnetizing current is input to a current value detector 207 via the magnetic head 1. The current value detector 207 detects the current value of the magnetizing current, outputs, to the processing circuit 203, the current value control signal for controlling the magnetizing current value, and further outputs the current value signal indicating the current value to a current monitor 208. The current monitor 208 displays the magnetizing current value. Moreover, the current monitor 208 is a monitor that a user confirms the value of the current flowing through the magnetic head 1. Therefore, even when the current monitor 208 is not disposed, the current application system 2 normally functions.

Figure 5:
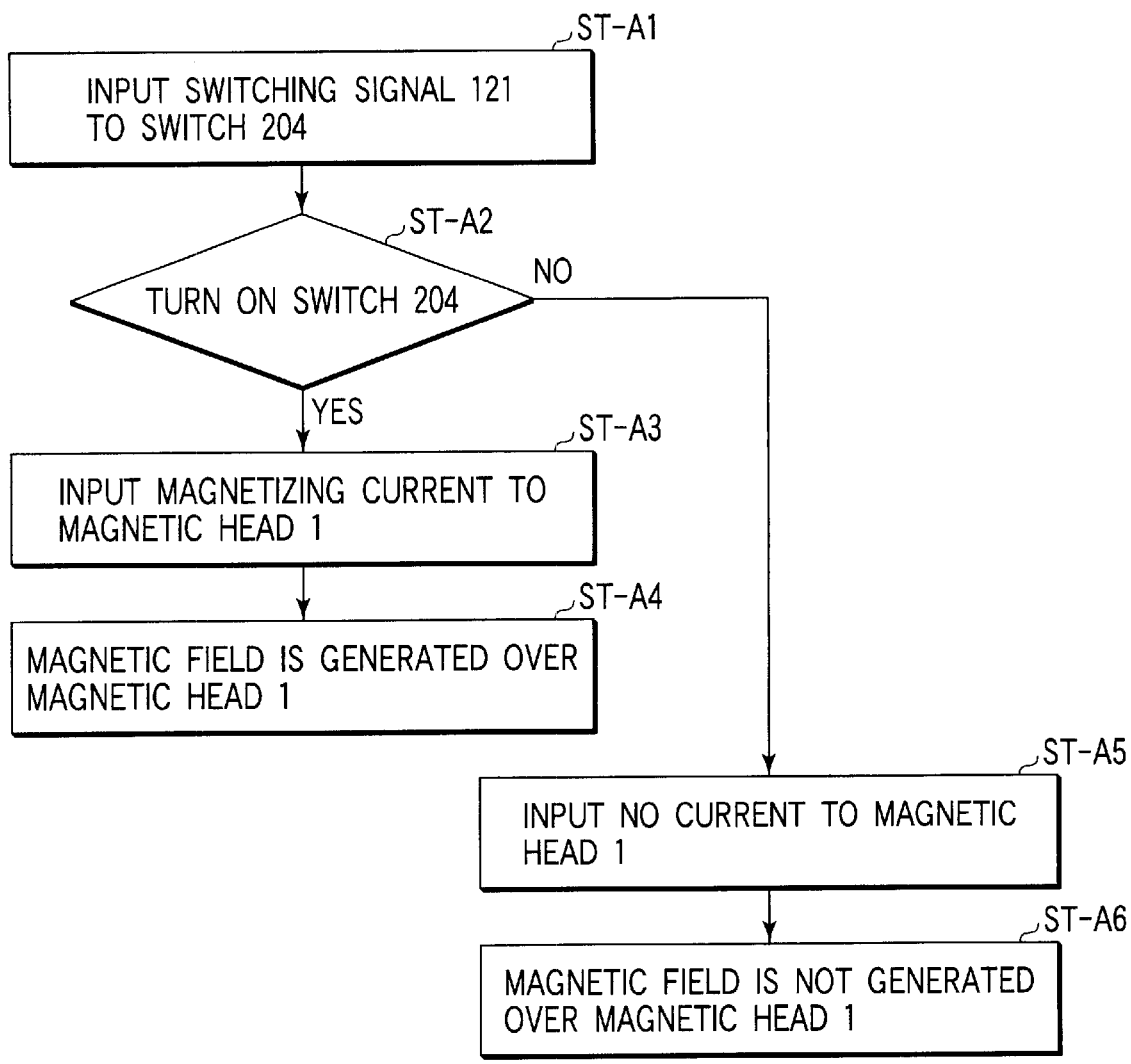
FIG. 5 is a flow chart showing flow that a switch is turned on or off to generate a magnetic field over the magnetic head according to the first embodiment of the present invention.

With reference to FIG. 5, flow of the embodiment of the magnetic field characteristics evaluation apparatus according to the embodiment of the present invention will be described. The switching signal 121 is input to the switch 204 (ST-A1). The switching signal 121 turns on or off the switch 204 (ST-A2). In case the switch 204 is turned on, a controlled signal that amplitude, phase, and frequency are controlled is amplified to preset values, and then the controlled signal is applied to the magnetic head 1 as a magnetizing current (ST-A3). In this case, magnetic field adjusted to a preset value is generated over the magnetic head 1 (ST-A4). On the other hand, in case the switch 204 is turned off, the magnetizing current is not applied to the magnetic head 1 (ST-A5). In this case, magnetic field is not generated over the magnetic head 1 (ST-A6).

For the current application system 2 shown in FIG. 4, an inner constitution slightly differs between a case a DC or a current with a low frequency less than about 1 MHz is passed through the magnetic head 1 (hereinafter referred to as low-frequency case), and another case a current with a high frequency of about 1 MHz or more is passed through the magnetic head (hereinafter referred to as high-frequency case). For the signal source 201, in the low-frequency case a normal signal generator, synthesizer or another low-frequency signal source is used, and in the high-frequency case a signal source of an RF (radio frequency) signal generator is mainly used. For the processing circuit 203, in the low-frequency case a general-purpose operational amplifier, mixer, or transistor is used, and in the high-frequency case, a high-frequency operational amplifier or a mixer (e.g. composed of gallium arsenic) or the like is used. Similarly for the switch 204, in the low-frequency case an analog switch IC (integrated circuit) or a transistor is used, or a mechanical switch is applied. In the high-frequency case, it is necessary to use a switch using for RF signal in which a high-frequency device (e.g. composed of gallium arsenic) or the like is used. Similarly in the amplification circuit 206, in the low-frequency case, an operational amplifier that can realize a high current output, or a booster circuit by the transistor may be realized. In the high-frequency case, the amplification circuit 206 needs to use the high-frequency device (e.g. composed of gallium arsenic) or the like (operational amplifier or transistor). The current value detector 207 is, for example, a combination of a current-to-voltage conversion circuit and an amplitude-to-direct current voltage converter in which an FET (field-effect transistor) operational amplifier or an FET is used. Especially in the high-frequency case, a method of using an electromagnetic induction, a current probe using an electric-field optical effect, or the like is also used. In signal lines 209 used to apply the current, in case the high-frequency current is applied to the magnetic head 1, it is necessary to use a cable or a terminal satisfactory in voltage standing-wave ratio characteristics. Moreover, incorporation of the voltage-to-current conversion circuit in the amplification circuit 206 makes the current value detector 207 or the current monitor 208 unnecessary.

Figure 6:
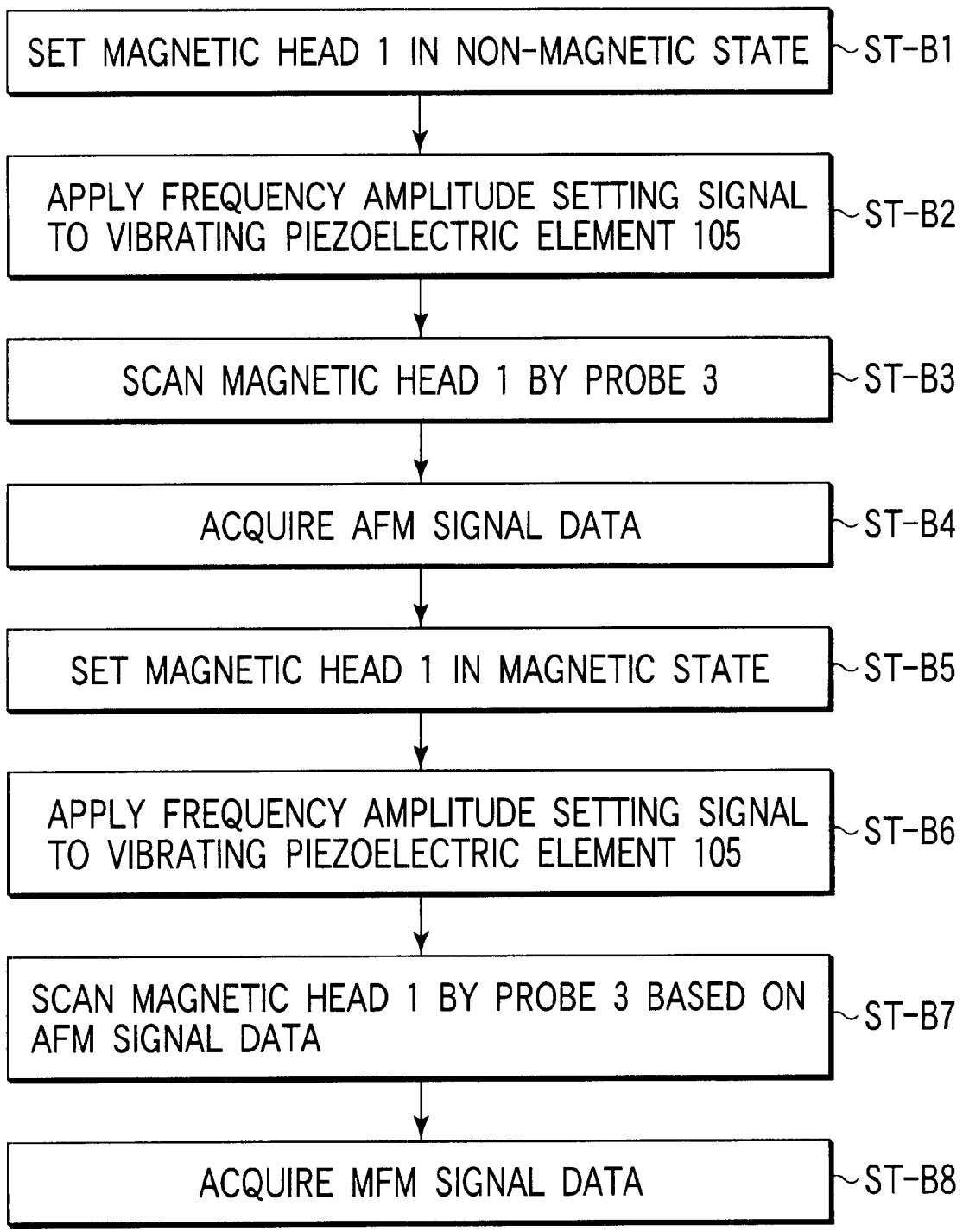
FIG. 6 is a flow chart showing flow that the AMF data and the MFM data about the magnetic head shown in FIG. 2 are acquired according to the first, a second or a third embodiment of the present invention.

In the aforementioned magnetic field characteristics evaluation apparatus, the surface configuration and magnetic field distribution of the magnetic head 1 are measured as follows. With reference to FIG. 6, in measurement by the AFM, first the switching signal 121 for setting the switch 204 to an off state to prevent the magnetic field from being generated from the magnetic head 1 is input to the switch 204 from the signal processor 11 (ST-B1). Subsequently, the probe 3 is brought close to the magnetic head 1 to implement the measurement by the AFM. A method of this measurement is similar to a usual AFM measurement method, and surface irregularities of the magnetic head 1 are measured. That is to say, the probe 3 is brought close to the magnetic head 1, and the frequency setting signal is applied to the vibrating piezoelectric element 105 at a frequency substantially almost equal to a resonance frequency $\omega_r$ of the cantilever 4 to vibrate the probe 3 (ST-B2). Moreover, in response to the scanning signal from the signal processor 11, the scanning piezoelectric element 107 is driven to linearly move the probe 3, and the surface of the magnetic head 1 is linearly scanned. After completing the scanning of a certain line, the next line is scanned, so that the surface of the magnetic head 1 is two-dimensionally scanned by the probe 3 with vibration (ST-B3). The displacement of the scanning probe 3 is detected by the displacement detector 8, and the amplitude signal as a displacement detection signal is supplied to the amplitude-to-direct current voltage converter 111. The amplitude-to-direct current voltage converter 111 generates the direct-current voltage signal corresponding to the amplitude, and supplies this signal to the feedback circuit 112. The feedback circuit 112 generates the feedback signal to maintain the amplitude of the probe 3 to be constant, and the feedback signal is supplied to the scanning piezoelectric element 107. Therefore, the surface of the magnetic head 1 is always scanned while the amplitude of the probe 3 is maintained to be constant. In case there are irregularities on the surface of the magnetic head 1, the direct-current voltage signal from the amplitude-to-direct current voltage converter 111 fluctuates. The feedback signal from the feedback circuit 112 varies in accordance with a size of the surface irregularities. This feedback signal is supplied as the AFM signal to the signal processor 11, and stored in the memory (not shown) together with a position signal corresponding to a scanned position (ST-B4). In the signal processor 11, the image signal can be generated by the AFM signal and position signal to generate the image with a shape in the surface of the magnetic head 1. In case the AFM measurement is executed in such non-magnetized state, the AFM signal 10 undergoes no influence by the magnetic field, and the surface configuration of the magnetic head 1 can accurately be measured.

In the measurement by the MFM, the magnetic field distribution over the magnetic head 1 is measured based on the surface configuration of the magnetic head 1 obtained by implementing the measurement by the AFM as described above. That is to say, based on the magnetic head surface configuration obtained by the AFM measurement, the probe 3 is detached from the magnetic head 1 by a predetermined constant distance (here, this distance depends on the apparatus), the distance is held, and the magnetic field distribution over the magnetic head 1 is measured. First, the current is applied to the magnetic head 1 from the current application system 2 to generate the magnetic field (ST-B5). The processing circuit 203 outputs the switching signal 121 for turning on the switch 204 to the switch 204 in order that the processed signal from the processing circuit 203 can be output to the amplification circuit 206. In case the switch 204 is turned on, the processed signal amplified by the amplification circuit 206 is applied as the magnetizing current to the magnetic head 1. The current value of the magnetizing current is detected in the current value detector 207, the current value control signal for controlling the magnetizing current value is output to the processing circuit 203 and the current value signal indicating the current value is output to the current monitor 208. A predetermined magnetizing current is applied to the magnetic head 1 in this manner. In this case, the magnetic field having intensity in accordance with the value of the current flowing through the magnetic head 1 is generated over the magnetic head 1.

Subsequently, the probe 3 is brought close to the magnetic head 1 to execute the measurement by the MFM. In this case, the signal is applied to the vibrating piezoelectric element 105 at the frequency substantially almost equal to the resonance frequency of the cantilever 4 by a circuit (not shown) for generating a frequency setting signal corresponding to a predetermined frequency, and the probe 3 is vibrated (ST-B6). Moreover, in response to the scanning signal from the signal processor 11, the scanning piezoelectric element 107 is driven, the probe 3 is linearly moved, and the surface of the magnetic head 1 is linearly scanned. After completing the scanning of the certain line, the next line is scanned, so that the surface of the magnetic head 1 is two-dimensionally scanned by the vibrating probe 3 (ST-B7). The displacement of the scanning probe 3 is detected by the displacement detector 8, the amplitude signal as the displacement detection signal is supplied to the phase detector 109. The phase detector 109 generates the phase signal corresponding to the amplitude, and this signal is converted to the MFM signal and supplied to the signal processor 11. In case the magnetic field exists on the surface of the magnetic head 1 in a certain scanned position, the phase signal in the phase detector 109 fluctuates, and the phase signal varies in accordance with a magnitude of the surface magnetic field. That is to say, the phase signal fluctuates in accordance with the magnitude of the magnetic field in the surface of the magnetic head 1. The phase signal is supplied as the MFM signal to the signal processor 11, and stored in the memory (not shown) together with the position signal corresponding to the scanned position (ST-B8). In the signal processor 11, the image signal can be generated by the MFM signal and position signal to generate the image of the magnetic field in the surface of the magnetic head 1.

As described above, the measurement by the AFM can be implemented under the state in which there is no magnetic field over the magnetic head 1, and the surface configuration of the magnetic head 1 can accurately be measured. Therefore, the distance to the probe 3 from the surface of the magnetic head 1 becomes constant, and the magnetic field distribution can also accurately be measured by the MFM.

Subsequently, after the measurement by the AFM in the non-magnetized state of the magnetic head 1, the surface of the magnetic head 1 is all scanned in a measuring process by the MFM in the magnetized state of the magnetic head 1 in a position in which the configuration of the magnetic head 1 is defined by the AFM measurement. Thereby, the accurate surface configuration of the magnetic head 1 and the magnetic field distribution in the vicinity of the magnetic head 1 can be measured.

Moreover, the displacement detector 8 and force measuring device 13 can also newly be developed to measure the magnetic head 1, but can be incorporated in a commercial or existing apparatus for use.

Furthermore, the AFM measurement may be a measurement by a static AFM which does not vibrate the cantilever 4, or a measurement by a dynamic AFM which measures the frequency while vibrating the cantilever 4. For the MFM measurement, any one of measurement of the magnetic field by the amplitude, measurement of the magnetic field by a phase modulation detecting method, and measurement of the magnetic field by a frequency modulation detecting method may be used. Alternatively, the measurement of the magnetic field by special alternating magnetic field whose AC component is measured by the synchronous wave detector or the like may also be used. In this case, the synchronous wave detector (no shown) needs to be disposed in the vicinity of the output end of the phase detector 109 as described above.

A concrete example of the magnetic field characteristics evaluation apparatus and magnetic field characteristics measuring method according to a second embodiment of the present invention will be described with reference to FIGS. 2, 7 and 8. FIG. 7 is a block diagram of the current application system 2 in the magnetic field characteristics evaluation apparatus in the second embodiment.

The magnetic field characteristics evaluation apparatus of the second embodiment is similar to the magnetic field characteristics evaluation apparatus of the first embodiment of the present invention except the constitution of the current application system 2. That is to say, the apparatus is provided with the probe 3 for scanning the surface of the magnetic head 1, the surface of the probe 3 being coated with the magnetic material or including the magnetic material, and the cantilever 4 on one end of which the probe 3 is supported. In order to vibrate the cantilever 4, the vibrating element (not shown) of the force measuring device 13 is disposed on the other end of the cantilever 4. The magnetic head 1 is connected to the current application system 2 for supplying the magnetizing current of a DC, an AC, or an AC and DC to the magnetic head 1. The signal generator 6 for outputting the external signal 7 that sets the magnetizing current to the current application system 2 is connected to the signal processor 11. Moreover, the signal processor 11 outputs the current setting signal for setting the magnetizing current to the signal generator 6, and outputs the switching signal 12 for turning on or off the magnetizing current or the current value setting signal 12 for setting the magnetizing current value to the current application system 2. The magnetic field characteristics evaluation apparatus shown in FIG. 2 is further provided with the displacement detector 8 for detecting the displacement of the probe 3, that is, the displacement of the tip end of the cantilever 4. The amplitude signal from this displacement detector 8 is processed by the force measuring device 13, and supplied as the AFM signal indicating the surface configuration of the magnetic head 1 and the MFM signal indicating the magnetic field distribution of the magnetic head 1 to the signal processor 11.

Moreover, the current application system 2 is different from that of the first embodiment in that instead of the switch 204 a controller 307 is disposed in the current application system 2 of the second embodiment. The controller 307 compares the value of the current that is detected by the current value control signal output from the current value detector 207 and that flows through the magnetic head 1, with the current value to be set by a current value setting signal 122 from the signal processor 11. The controller 307 further outputs a control signal to the processing circuit 203 to control the current value such that a desired current value flows through the magnetic head 1.

The frequency signal from the signal source 201, the external signal 7, and the current value control signal for controlling the current value are input to the processing circuit 203. The processing circuit adds or modulates (amplitude modulation, phase modulation, frequency modulation) these signal, and outputs the processed signal to the amplification circuit 206.

The other devices in the current application system 2 operate similarly as those in the current application system 2 of the first embodiment.

With reference to FIG. 8, flow of the embodiment of the magnetic field characteristics evaluation apparatus according to the second embodiment of the present invention will be described. The current value setting signal 122 is input to the controller 307 (ST-C1). The current value setting signal 122 is compared with a presetting signal output from the current value detector 207 (ST-C2). In case the current value setting signal 122 is set so that the magnetizing current having a preset value flows through the magnetic head 1, a controlled signal that amplitude, phase, and frequency are controlled is amplified to preset values, and then the controlled signal is applied to the magnetic head 1 as a magnetizing current (ST-C3). In this case, magnetic field adjusted to a preset value is generated over the magnetic head 1 (ST-C4). On the other hand, in case the current value setting signal 122 is set so that no magnetizing current flows through the magnetic head 1, the magnetizing current is not applied to the magnetic head 1 (ST-C3). In this case, magnetic field is not generated over the magnetic head 1 (ST-C5).

Here, the current value setting signal 122 does not have to be one bit signal such as the switching signal 121 to be turned on or off as shown in FIG. 4. If necessary, a digital signal of a plurality of bits or an analog signal as in an auto-gain control circuit can also control the current value setting signal.

Use of the magnetic field characteristics evaluation apparatus of the second embodiment for measuring the surface configuration and magnetic field distribution of the magnetic head 1 is similar to use of the magnetic field characteristics evaluation apparatus of the first embodiment.

Moreover, in case the magnetic field characteristics evaluation apparatus of the second embodiment is used, a desired magnitude of the magnetic field is generated by the current value setting signal 122, and characteristics of the magnetic head 1 can be evaluated. For example, image measurement dependent on the applied current value can be automated, or the current value is changed while the probe 3 does not scan the surface, so that a saturated current value of the magnetic field generated from the magnetic head 1 can be measured.

Figure 9:
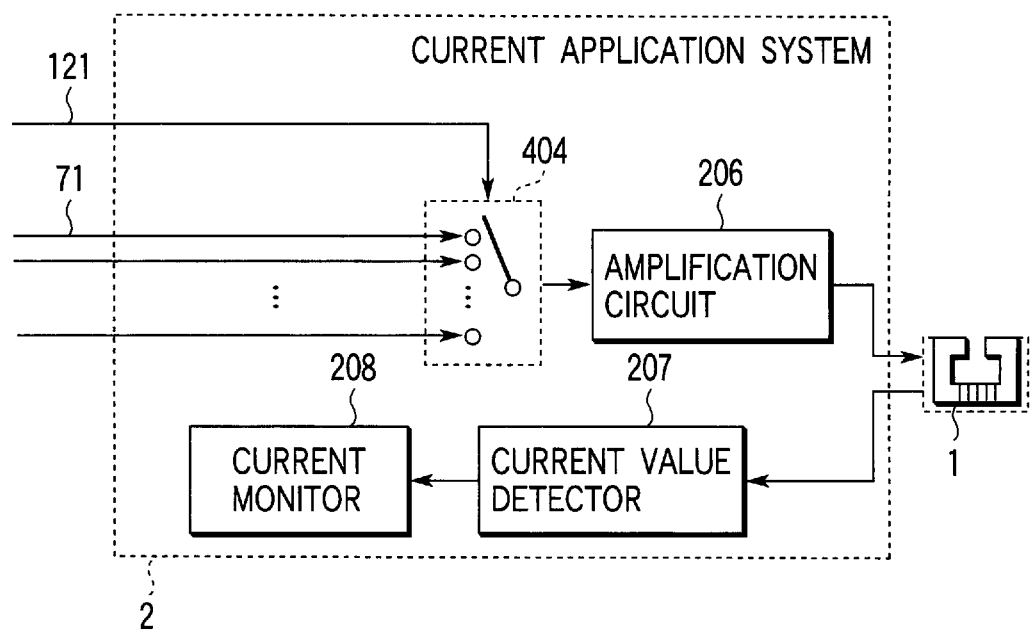
FIG. 9 is a functional block diagram in the current application system in the third embodiment of the present invention.

A concrete example of the magnetic field characteristics evaluation apparatus and measuring method according to a third embodiment of the present invention will be described with reference to FIGS. 2, 9 and 10. FIG. 9 is a block diagram of the current application system 2 in the magnetic field characteristics evaluation apparatus in the third embodiment.

The magnetic field characteristics evaluation apparatus of the third embodiment is similar to the magnetic field characteristics evaluation apparatus of the first embodiment of the present invention except the constitution of the current application system 2. That is to say, the apparatus is provided with the probe 3 for scanning the surface of the magnetic head 1, the surface of the probe 3 being coated with the magnetic material or including the magnetic material, and the cantilever 4 on one end of which the probe 3 is supported. In order to vibrate the cantilever 4, the vibrating element (not shown) of the force measuring device 13 is disposed on the other end of the cantilever 4. The magnetic head 1 is connected to the current application system 2 for supplying the magnetizing current of a DC, an AC, or an AC and DC to the magnetic head 1. The signal generator 6 for outputting the external signal 7 that sets the magnetizing current to the current application system 2 is connected to the signal processor 11. Moreover, the signal processor 11 outputs the current setting signal for setting the magnetizing current to the signal generator 6, and outputs, to the current application system 2, the switching signal 12 for turning on or off the magnetizing current or the current value setting signal 12 for setting the magnetizing current value. The magnetic field characteristics evaluation apparatus shown in FIG. 2 is further provided with the displacement detector 8 for detecting the displacement of the probe 3, that is, the displacement of the tip end of the cantilever 4. The amplitude signal from this displacement detector 8 is processed by the force measuring device 13, and supplied as the AFM signal indicating the surface configuration of the magnetic head 1 and the MFM signal indicating the magnetic field distribution of the magnetic head 1 to the signal processor 11.

The current application system 2 of the third embodiment is different from the current application system 2 of the first embodiment, in that the current application system 2 is provided with a switch 404 without disposing the signal source 201, processing circuit 203, switch 204, or signal line for transmitting the control signal.

A plurality of external signals 71 and the switching signal 121 for switching on or off the switch 404 are input to the switch 404 to control the value of the current flowing through the magnetic head 1, the current phase, and the current frequency. In this case, a signal generator for outputting the plurality of external signals also requires a plurality of output terminals (not shown).

Figure 10:
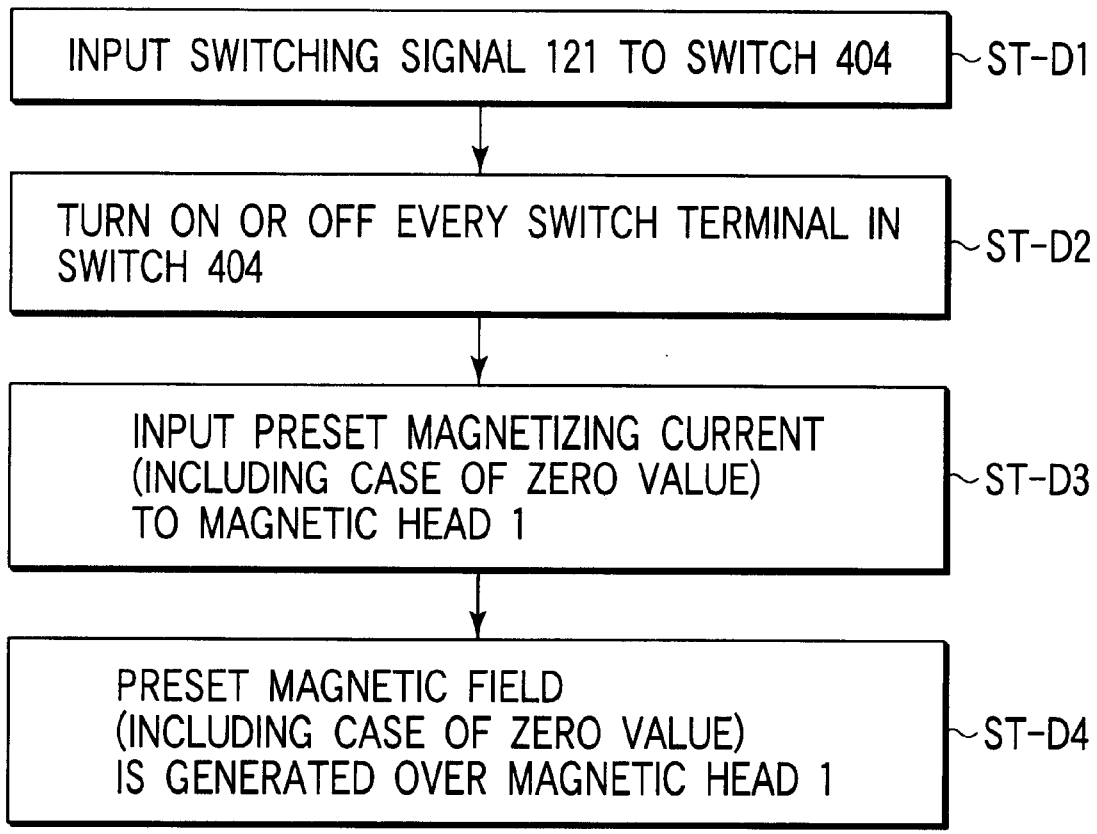
FIG. 10 is a flow chart showing flow that every switch terminal is turned on or off to generate a desired magnetic field over the magnetic head shown in FIG. 9 according to the third embodiment of the present invention.

With reference to FIG. 10, flow of the embodiment of the magnetic field characteristics evaluation apparatus according to the third embodiment of the present invention will be described. The switching signal 121 is input to the switch 404 (ST-D1). The switching signal 121 turns on or off every switch terminal connected to a predetermined external signal 71 in switch 404 (ST-D2). In case the switch terminal connected to predetermined external signal 71 in switch 404 is turned on, a controlled signal that amplitude, phase, and frequency are controlled is amplified to one of preset values, and then the controlled signal is applied to the magnetic head 1 as a magnetizing current (ST-D3). Here amplitude, phase, and frequency are set based on whether or not the switch terminal connected to a predetermined external signal 71 is turn on. In this case, magnetic field adjusted to a preset value is generated over the magnetic head 1 (ST-D4). On the other hand, in case the switch 404 is turned off, the magnetizing current is not applied to the magnetic head 1 (ST-D3). In this case, magnetic field is not generated over the magnetic head 1 (ST-D4).

The other devices in the current application system 2 of the third embodiment operate similarly as those in the current application system 2 of the first embodiment.

Instead of one bit signal to be turned on or off in the switch 204 in the current application system 2 shown in FIG. 4, the switch 404 can be controlled by the digital signal of a plurality of bits. Moreover, the switch 404 is not limited to such digital switch, and any switch constitution in which a signal type can be controlled may be used. For example, the controller 307 and current value setting signal 122 shown in FIG. 7 may be incorporated in the current application system 2 of the third embodiment, so that the current value can be changed. Moreover, the apparatus may be of a composite apparatus in which the signal source 201 can be controlled from the outside, or a voltage controlled oscillator or the like can be used to control a signal waveform or frequency. In case such current application system 2 for controlling the current flowing through the magnetic head 1 is used, the AFM measurement can be implemented without applying any current, and the MFM measurement can be implemented by automating the dependence of the measurement on the applied current frequency and current value.

Prior to description of a fourth embodiment of the magnetic field characteristics evaluation apparatus of the embodiment of the present invention, a principle of the apparatus will be described.

In the present embodiment, a basic principle is that the surface of a magnetic field generating member with the magnetic field generated therein over such as the magnetic head, is scanned by the AFM to specify a magnetic field leak or another portion with intense magnetic field. Here, the AFM is an apparatus for scanning the surface of the magnetic field generating member with the probe to measure the surface configuration of the magnetic field generating member. In the measurement by the AFM, since the probe moves along the irregularities of the surface configuration, the AFM signal indicating the surface configuration of the magnetic field generating member can be obtained.

Figure 11:
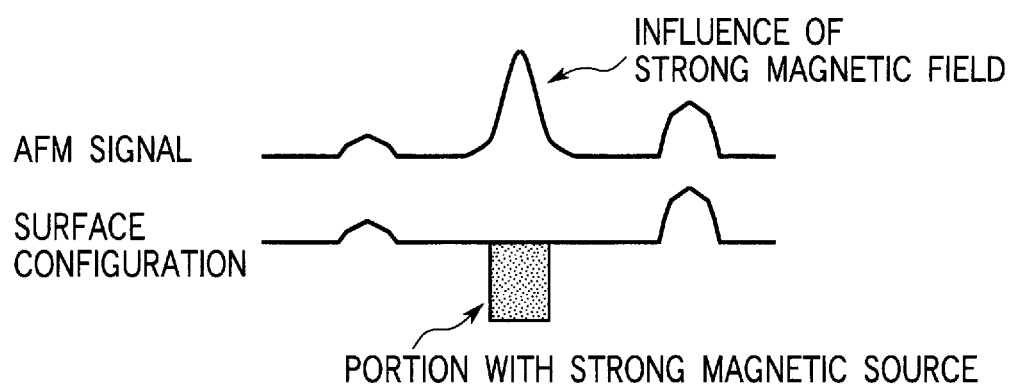
FIG. 11 shows respective waveform diagrams of the surface configuration with irregularities having the portion whose magnetic field is intense in a specific position, and the AFM signal indicating the output surface configuration as a result of measurement of the surface configuration with the conventional magnetic field characteristics evaluation apparatus.

In the measurement by the AFM, in case the probe is formed of the magnetic material, the probe scans the position where the magnetic field of the magnetic field generating member exists. Then, as shown in FIG. 11, even when the position with the magnetic field present therein is flat, the probe reacts with the magnetic field, and the AFM signal has a peak in the position where the magnetic field exists. On the other hand, in case the probe is not formed of the magnetic material, the AFM does not react with the magnetic field, and the surface configuration of the magnetic field generating member is accurately measured by the AFM.

In case the AFM is used with the probe formed of the magnetic material in this manner, the magnetic field of the magnetic field generating member for generating the magnetic field, such as the magnetic head, can be measured. Especially in the magnetic field generating member that can generate or eliminate the magnetic field from the magnetic head by applying or not applying the current to the magnetic head, the position where the magnetic field exists can be specified. That is to say, first in case no current is applied to the magnetic head and the magnetic field generated from the magnetic head is eliminated, the probe scans the magnetic field generating member and the AFM signal is measured. The measured AFM signal of a case in which the magnetic head is in the non-magnetized state is stored in the memory. Subsequently, in case the current is applied to the magnetic head and the magnetic field is generated from the magnetic head, the probe scans the magnetic field generating member and the AFM signal is measured. The measured AFM signal of a case in which the magnetic head is in the magnetized state is stored in the memory. Moreover, a difference between the AFM signal measured while the magnetic head is in the non-magnetized state and the AFM signal measured while the magnetic head is in the magnetized state is taken. Therefore, the difference of above two AFM signals has a peak only in the position where a stronger magnetic field than other area over the magnetic head exists, and the position where the magnetic field over the magnetic head exists can be specified.

Figure 12:
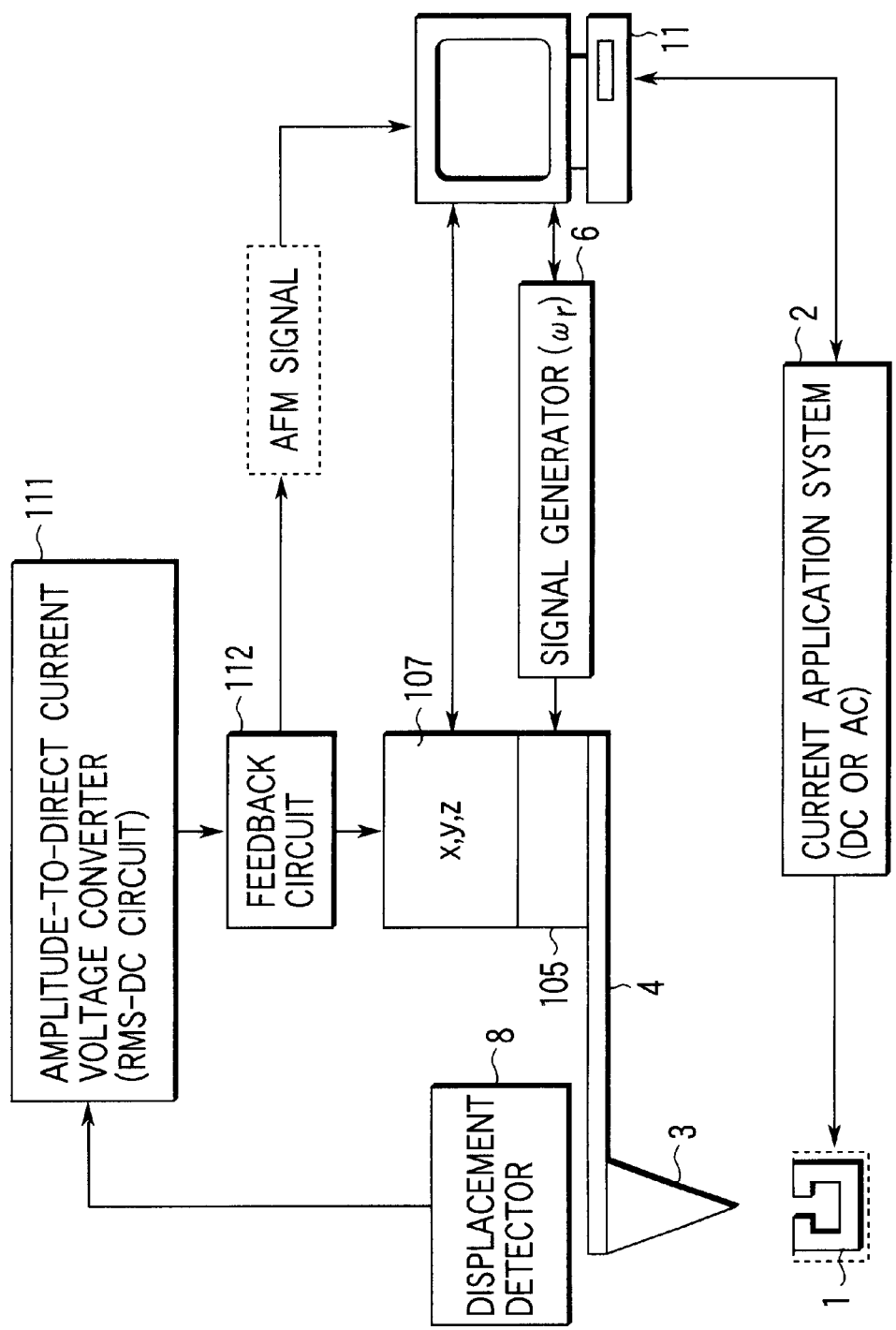
FIG. 12 is a functional block diagram of the magnetic field characteristics evaluation apparatus including the magnetic head as the magnetic field generating member according to a fourth embodiment of the present invention.

A concrete example of the magnetic field characteristics evaluation apparatus and measuring method according to the fourth embodiment of the present invention will be described with reference to FIGS. 12 to 15B. FIG. 12 is a block diagram of the magnetic field characteristics evaluation apparatus including the magnetic head as a magnetic field generating member.

The magnetic field characteristics evaluation apparatus shown in FIG. 12 is provided with the probe 3 for scanning the surface of the magnetic head 1, the surface of the probe 3 being coated with the magnetic material or including the magnetic material, and the cantilever 4 on one end of which the probe 3 is supported. The magnetic head 1 is connected to a current application system 2 for supplying the magnetizing current of a DC, an AC, or an AC and DC to the magnetic head 1. In order to vibrate the cantilever 4, the vibrating piezoelectric element 105 is disposed on the other end of the cantilever 4. The cantilever 4 is supported by the vibrating piezoelectric element 105. A frequency amplitude setting signal for vibrating the vibrating piezoelectric element 105 is applied to the piezoelectric element 105 from the signal generator 6. The vibrating piezoelectric element 105 is supported by the scanning piezoelectric element 107. In case the scanning signal is input to the scanning piezoelectric element 107 from the signal processor 11, the scanning piezoelectric element 107 is distorted in the three-dimensional direction (x, y, and z directions). As a result, the cantilever 4 supported by the scanning piezoelectric element 107 is displaced in the three-dimensional direction, so that the probe 3 can scan the surface of the magnetic head 1. The magnetic field characteristics evaluation apparatus shown in FIG. 12 is further provided with the displacement detector 8 for detecting the displacement of the probe 3, in other words, the displacement of the tip end of the cantilever 4. The amplitude signal from the displacement detector 8 is supplied to the amplitude-to-direct current voltage converter 111. In the amplitude-to-direct current voltage converter 111, the amplitude signal is converted to the direct-current voltage signal, and supplied to the feedback circuit 112. The feedback signal is generated based on the amplitude signal converted to the direct-current voltage signal. The feedback signal is supplied to the scanning piezoelectric element 107, and further supplied as the AFM signal to the signal processor 11. Additionally, the scanning piezoelectric element 107 supports the vibrating piezoelectric element 105, but the scanning piezoelectric element 107 may be disposed in the position for supporting the magnetic head 1. That is to say, the scanning piezoelectric element 107 may be disposed so that the relative position of the magnetic head 1 and probe 3 can be adjusted.

The current application system 2 is a circuit for applying the current adjusted to indicate the predetermined value to the magnetic head 1 for generating the magnetic field from the magnetic head 1. Here, the current passed through the magnetic head 1 may be a DC, an AC, or an AC and DC. The probe 3 is coated and magnetized with the magnetic material. This probe 3 measures the surface configuration and surface magnetic field of the magnetic head 1 as the magnetic field generating member. Additionally, the probe 3 is not limited to the probe coated with the magnetic material or including the magnetic material, and the probe itself may be formed of the magnetic material, or a part of the probe may be formed of the magnetic material. The cantilever 4 is connected to the probe 3 on one end thereof, and has the mechanical resonance frequency $\omega_r$.

The vibrating piezoelectric element 105 is attached to the end portion being different from the tip end of the cantilever 4 to which the probe 3 is attached. The vibrating piezoelectric element 105 vibrates the cantilever 4 at the desired frequency. The signal generator 6 inputs the predetermined frequency amplitude setting signal to the vibrating piezoelectric element 105 for vibrating the cantilever 4 at the desired frequency.

The scanning piezoelectric element 107 is disposed on the vibrating piezoelectric element 105 to three-dimensionally move the cantilever 4 and adjust the relative position between the magnetic head 1 and probe 3 to the desired position. That is to say, the cantilever 4 is moved by the predetermined amount on the plane parallel to the surface of the magnetic head 1 facing the probe 3, and the plane parallel to the plane vertical to the surface of the magnetic head 1. Thereby, the relative position between the magnetic head 1 and probe 3 is adjusted.

The displacement detector 8 is disposed in the vicinity of the cantilever 4 to detect the displacement of the cantilever 4 and output the displacement as the amplitude signal indicating the amplitude. The displacement detector 8 is usually provided with the laser light source and a four-quadrant photodiode, and inputs the reflected light of laser light to the four-quadrant photodiode to detect the displacement. Alternatively, the displacement detector may be provided with the laser light source and optical fiber, and detect the displacement by interference of the laser light.

The amplitude-to-direct current voltage converter 111 is a circuit for converting the amplitude signal supplied from the displacement detector 8 to the direct-current voltage signal. The direct-current voltage signal corresponding to the amplitude of the cantilever 4 is generated from the amplitude-to-direct current voltage converter 111. This direct-current voltage signal is input to the feedback circuit 112. The feedback circuit 112 generates the feedback signal for suppressing vibration of the scanning piezoelectric element 107 to set the amplitude to be constant. This feedback signal is supplied to the scanning piezoelectric element 107, and further supplied as the AFM signal to the signal processor 11.

The signal processor 11 detects the value of the current flowing through the magnetic head 1 from the current application system 2, and outputs a level setting signal for setting a level of a current flowing through the magnetic head 1. Moreover, the signal processor 11 detects the frequency of the frequency amplitude setting signal for setting the frequency and amplitude of the cantilever 4 output from the signal generator 6. Then, the frequency amplitude setting signal for setting the desired frequency and amplitude is output to the signal generator 6. Furthermore, the signal processor 11 detects a three-dimensional coordinate of the position signal which indicates the position of the cantilever 4 and which is output from the scanning piezoelectric element 107. Moreover, the AFM signal indicating the surface configuration and surface magnetic field of the magnetic head 1 as the magnetic field generating member is input from the feedback circuit 112. Furthermore, in the signal processor 11, the current value signal indicating the value of the current flowing through the magnetic head 1, the frequency signal indicating the frequency of the cantilever 4, the position signal of the cantilever 4, and the AFM signal indicating the surface configuration and surface magnetic field of the magnetic head 1 as the magnetic field generating member are input and stored. The signal processor 11 has a function of processing these signals to generate the image signal, and displaying the image of the magnetic head 1.

Figure 13:
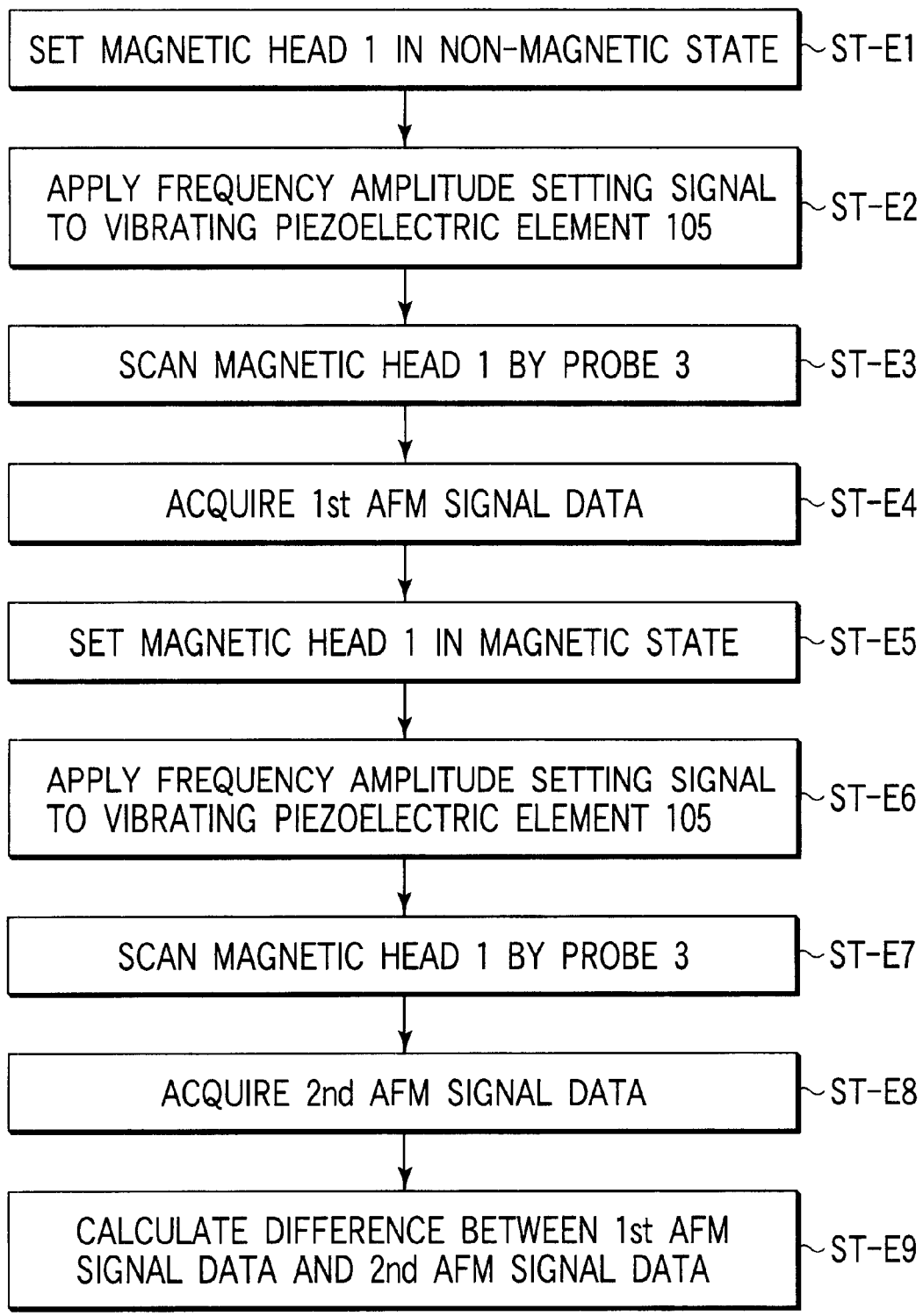
FIG. 13 is a flow chart showing flow that a magnetic field over the magnetic head shown in FIG. 12 is acquired based on first AMF data and second AFM data according to the fourth or a fifth embodiment of the present invention.

In the aforementioned magnetic field characteristics evaluation apparatus, the magnetic field distribution of the magnetic head is measured as follows. With reference to FIG. 13, flow of the embodiment of the magnetic field characteristics evaluation apparatus according to the fourth embodiment of the present invention will be described.

No current is applied to the magnetic head 1 from the current application system 2, and the surface of the magnetic head 1 is measured in the non-magnetized state in which no magnetic field is generated from the magnetic head 1 (ST-E1). The method of the measurement is similar to the usual AFM measurement method, and the surface irregularities of the magnetic head 1 are measured. That is to say, the probe 3 is brought close to the magnetic head 1, and the signal generator 6 applies the frequency amplitude setting signal to the vibrating piezoelectric element 105 at the frequency substantially almost equal to the resonance frequency $\omega_r$ of the cantilever 4 to vibrate the probe 3 (ST-E2). Moreover, in response to the scanning signal from the signal processor 11, the scanning piezoelectric element 107 is driven to linearly move the probe 3, and the surface of the magnetic head 1 is linearly scanned. After completing the scanning of the certain line, the next line is scanned, so that the surface of the magnetic head 1 is two-dimensionally scanned by the vibrating probe 3 (ST-E3). The displacement of the scanning probe 3 is detected by the displacement detector 8, and the amplitude signal is supplied as the displacement detection signal to the amplitude-to-direct current voltage converter 111. The amplitude-to-direct current voltage converter 111 generates the direct-current voltage signal corresponding to the amplitude, and supplies this signal to the feedback circuit 112. The feedback circuit 112 generates the feedback signal to maintain the amplitude of the probe 3 to be constant, and the feedback signal is supplied to the scanning piezoelectric element 107. Therefore, the surface of the magnetic head 1 is always scanned while the amplitude of the probe 3 is maintained to be constant. In case there are irregularities on the surface of the magnetic head 1, the direct-current voltage signal output from the amplitude-to-direct current voltage converter 111 fluctuates, and the feedback signal output from the feedback circuit 112 fluctuates in accordance with the size of the surface irregularities. This feedback signal is supplied as the AFM signal to the signal processor 11, and stored in the memory (not shown) together with the position signal corresponding to the scanned position (ST-E4). In the signal processor 11, the image signal can be generated by the AFM signal and position signal to generate the image with the shape in the surface of the magnetic head 1.

Subsequently, the current is applied to the magnetic head 1 from the current application system 2 to magnetize the magnetic head 1 (ST-E5). While the magnetic field is generated from the magnetic head 1, the surface of the magnetic head 1 is measured as well as the aforementioned measurement by AFM. That is to say, the current is applied to the magnetic head 1 from the current application system 2 to generate the magnetic field. In this case, a DC, an AC, or an AC and DC current may be applied. Thereafter, the probe 3 is brought close to the magnetic head 1 to implement the measurement by the AFM. In this case, the signal generator 6 applies the frequency amplitude setting signal to the vibrating piezoelectric element 105 at the frequency substantially almost equal to the resonance frequency $\omega_r$ of the cantilever 4 (ST-E6). Thereby, the probe 3 is vibrated. Moreover, in response to the scanning signal from the signal processor 11, the scanning piezoelectric element 107 is driven to linearly move the probe 3, and the surface of the magnetic head 1 is linearly scanned. After completing the scanning of the certain line, the next line is scanned, so that the surface of the magnetic head 1 is two-dimensionally scanned by the vibrating probe 3 (ST-E7). The displacement of the scanning probe 3 is detected by the displacement detector 8, and the amplitude signal is supplied as the displacement detection signal to the amplitude-to-direct current voltage converter 111. The amplitude-to-direct current voltage converter 111 generates the direct-current voltage signal corresponding to the amplitude, and supplies this signal to the feedback circuit 112. The feedback circuit 112 generates the feedback signal to maintain the amplitude of the probe 3 to be constant, and the feedback signal is supplied to the vibrating piezoelectric element 105. Therefore, the surface of the magnetic head 1 is always scanned while the amplitude of the probe 3 is maintained to be constant. In case the magnetic field is present on the surface of the magnetic head 1 in the certain scanned position, the direct-current voltage signal from the amplitude-to-direct current voltage converter 111 fluctuates. The feedback signal from the feedback circuit 112 varies in accordance with the magnitude of the surface magnetic field. Moreover, even when there are irregularities on the surface of the magnetic head 1, the feedback signal varies in accordance with the size of the irregularities. Specifically, the feedback signal fluctuates in accordance with the magnitude of the magnetic field and the size of the irregularities in the surface of the magnetic head 1. This feedback signal is supplied as the AFM signal to the signal processor 11, and stored in the memory (not shown) together with the position signal corresponding to the scanned position (ST-E8). In the signal processor 11, the image signal can be generated by the AFM signal and position signal to form the image of the magnetic field and shape in the surface of the magnetic head 1.

In case the magnetic field is generated in the magnetic head 1, image information on the already obtained surface irregularities is included in the image information. Therefore, in case the image information on the irregularities is removed from the image information on the magnetic field, the image indicating only the magnetic field intensity can be displayed. That is to say, the difference between the AFM signal in the magnetized state of the magnetic head 1 and the AFM signal in the non-magnetized state of the magnetic head 1 is calculated (ST-E9). Thereby, the image signal indicating only the magnetic field intensity over the magnetic head 1 can be generated. Furthermore, the image indicating only the magnetic field intensity over the magnetic head 1 can be displayed on the signal processor 11. Moreover, as compared with the display of each image, in case the application current to be applied to the magnetic head 1 is turned on or off to display image for each line or each point, influence of heat drift is reduced, and therefore the image can be processed.

Moreover, in case the magnetic field characteristics evaluation apparatus of the present embodiment is used to change the current value and frequency of the current applied to the magnetic head 1, the dependence in the respective values can be measured. The frequency signal and current value signal are input to the signal processor 11 from the signal generator 6 and current application circuit 2. The signal processor 11 stores and monitors, and can control the frequency of the cantilever 4 and the value of the current applied to the magnetic head 1. Moreover, another mode of the present embodiment will be described with reference to FIG. 14. In the mode, in the normal magnetic head that can be used as a product (hereinafter referred to as the normal head) and a defective magnetic head that cannot be used as the product (hereinafter referred to as the defective head), a magnetic field generating portion is contrasted. FIG. 14 is a diagram showing modes of the leak magnetic field of the normal head and defective head in some predetermined application current values. Black portions in FIG. 14 show places where the magnetic field is large. Additionally, a white arrow mark shows a place whose magnetic field is larger than the magnetic field in the magnetic head 1. Moreover, for FIG. 14, the actual magnetic head 1 is drawn at (a) to (f) in FIG. 14. A magnetic head portion spreading in a lower part of each diagram is a magnetic pole 15, and a magnetic head portion drawn in an upper part of the diagram is a magnetic pole 16. There is a gap 17 between the magnetic poles 15 and 16.

As shown on the left side of FIG. 14, in a normal head, contrast is clear and only the position of the gap 17 of the magnetic head 1 is very dark. It is seen that the magnetic field is large in this dark portion. Moreover, in any current value no large magnetic field portion (i.e. leak magnetic field portion) other than the gap position is observed. On the other hand, as shown on the right side of FIG. 14, it is seen that in a defective head the leak magnetic field is generated from the portion other than the gap 17. That is to say, the leak magnetic field is generated from the magnetic pole 16 (One place at (d) in FIG. 14 and (e) in FIG. 14, and three places at (f) in FIG. 14).

Furthermore, the correspondence between the state of the magnetic field of a recording medium on which the aforementioned defective head is used to record the data, and the image by the AFM of the magnetic head will be described with reference to FIGS. 15A and 15B. FIG. 15A is a diagram showing the state of the magnetic field of the recording medium on which the defective head is used to record the data, and showing the image observed by a magnetic force microscope. FIG. 15B is a diagram of the image showing the state of the magnetic field in the magnetic head used in recording information on the recording medium shown in FIG. 15A. Both in FIGS. 15A and 15B, a black portion represents a portion with an intense magnetic field similar to FIG. 14. Additionally, an arrow and characters denote a distance in an indicated position, and do not represent the portion with the intense magnetic field.

In FIG. 15A, the defective head is used in recording the information, both end portions of three magnetization transition lines were first recorded, and next a middle portion was recorded. Here, the middle portion was overwritten/recorded 1000 times. As seen from FIG. 15A, there are places where magnetization transition portion disappears in the same direction as that of a black dot line shown by a dotted arrow. This interval measured about 2.3 $\mu$m. Moreover, in case an interval between the leak magnetic fields of the defective head was obtained by the magnetic field characteristics evaluation apparatus of the embodiment of the present invention as shown in FIG. 15B, it was about 2.3 $\mu$m. This agrees with the interval between the disappeared portions of FIG. 15A. Therefore, it has clearly been proved that in case this defective head is used in a hard disk, an adjacent track is influenced by the leak magnetic field generated from the magnetic pole 16 shown in FIG. 15B. It is impossible to specify the position that has a width of 2.3 $\mu$m and from which the magnetic field leaks as a "point" only from the MFM image of the recording medium shown in FIG. 15A. However, in case the magnetic head 1 is measured by this embodiment of the present invention, the position from which the magnetic field leaks can be specified as the "point".

Therefore, according to the magnetic field characteristics evaluation apparatus and measuring method of the embodiment of the present invention, in case only the AFM is used to measure the magnetic head, the magnetic fields such as the leak magnetic field can be measured.

Figure 16:
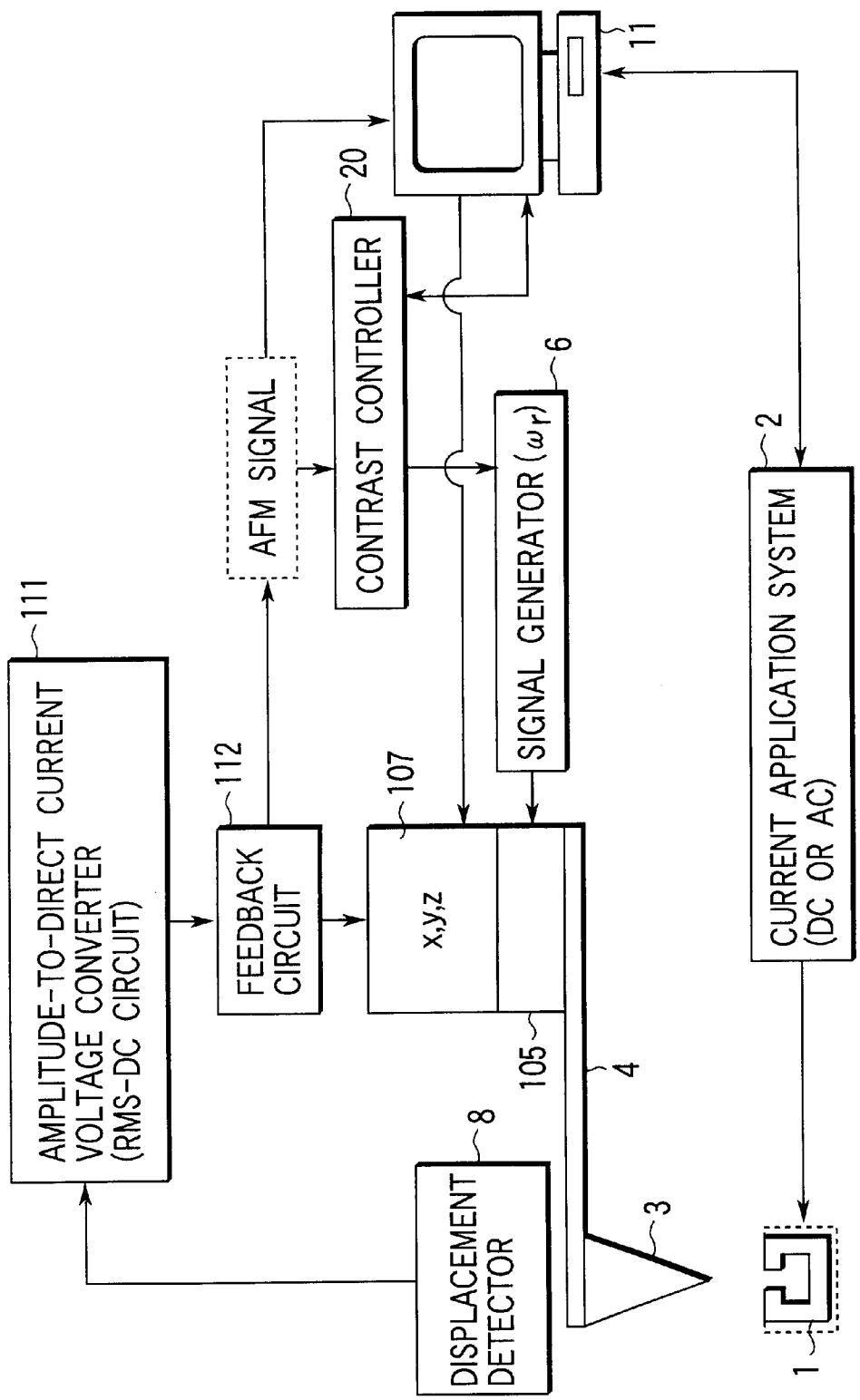
FIG. 16 is a functional block diagram of the magnetic field characteristics evaluation apparatus including the magnetic head as the magnetic field generating member according to the fifth embodiment of the present invention.

A concrete example of the magnetic field characteristics evaluation apparatus and measuring method according to a fifth embodiment of the present invention will be described with reference to FIG. 16. FIG. 16 is a block diagram of the magnetic field characteristics evaluation apparatus including the magnetic head as a magnetic field generating member in the fifth embodiment.

The magnetic field characteristics evaluation apparatus shown in FIG. 16 is similar to the magnetic field characteristics evaluation apparatus of the fourth embodiment of the present invention except in that a contrast controller 20 is disposed. That is to say, the apparatus is provided with the probe 3 for scanning the surface of the magnetic head 1, the surface of the probe 3 being coated with the magnetic material or including the magnetic material, and the cantilever 4 on one end of which the probe 3 is supported. The magnetic head 1 is connected to the current application system 2 for supplying the magnetizing current of a DC, an AC, or an AC and DC to the magnetic head 1. In order to vibrate the cantilever 4, the vibrating piezoelectric element 105 is disposed on the other end of the cantilever 4. The cantilever 4 is supported by the vibrating piezoelectric element 105. The frequency amplitude setting signal for vibrating the vibrating piezoelectric element 105 is applied to the piezoelectric element 105 from the signal generator 6. The vibrating piezoelectric element 105 is supported by the scanning piezoelectric element 107. In case the scanning signal is input to the scanning piezoelectric element 107 from the signal processor 11, the scanning piezoelectric element 107 is distorted in the three-dimensional direction (x, y, and z directions). As a result, the cantilever 4 supported by the scanning piezoelectric element 107 is displaced in the three-dimensional direction, so that the probe 3 can scan the surface of the magnetic head 1. The magnetic field characteristics evaluation apparatus shown in FIG. 16 is further provided with the displacement detector 8 for detecting the displacement of the probe 3, that is, the displacement of the tip end of the cantilever 4. The amplitude signal from the displacement detector 8 is supplied to the amplitude-to-direct current voltage converter 111. In the amplitude-to-direct current voltage converter 111, the amplitude signal is converted to the direct-current voltage signal, and supplied to the feedback circuit 112. The feedback signal is generated based on the amplitude signal converted to the direct-current voltage signal. The feedback signal is supplied to the scanning piezoelectric element 107, and further supplied as the AFM signal to the signal processor 11.

The contrast controller 20 is an apparatus for detecting an intensity signal indicating an intensity distribution of the AFM signal in case the AFM signal is input to the controller 20 from the feedback circuit 112. The controller 20 outputs a frequency amplitude control signal for controlling the frequency and amplitude of the cantilever 4 to the signal generator 6 based on the intensity signal to adjust the contrast of an AFM image displayed in the signal processor 11. Here, in the contrast adjustment, the size of the black portion which is displayed in the signal processor 11 and in which the magnetic field exists is adjusted. Concretely, in case the magnetic field exists and is measured, only the certain position with a certain magnetic field intensity or a higher intensity is blackened, and a threshold value is set in the intensity of the displayed magnetic field such that all is not white or black on a displayed screen. The contrast of the displayed image is adjusted in accordance with a magnitude of this threshold value. Moreover, a user may operate the signal processor to adjust the contrast of the displayed image. In this case, a contrast adjustment signal for adjusting the contrast of the displayed image is output to the contrast controller 20 from the signal processor 11. Then, the contrast controller 20 outputs the frequency amplitude control signal for controlling the frequency and amplitude of the cantilever 4 to the signal generator 6 to adjust the contrast of the AFM image displayed in the signal processor 11. In case the contrast controller 20 is connected to the signal processor 11, the contrast of the image displayed in the signal processor 11 and showing the place in which the magnetic field is generated can be adjusted to be appropriate.

Moreover, the signal processor 11 is similar to the signal processor 11 described in the fourth embodiment except in that the signal processor 11 is connected to the contrast controller 20.

The aforementioned magnetic field characteristics evaluation apparatus is similar to that of the fourth embodiment except in that the position with the magnetic field generated therein can easily be specified over the magnetic head 1 as the magnetic field generating member by controlling the image contrast. Therefore, action and effect obtained by disposing the contrast controller 20 will mainly be described hereinafter.

In case the value of the current flowing through the magnetic head 1 is increased, the magnetic field generated from the magnetic head 1 becomes excessively large, and it is sometimes difficult to measure a change of the image contrast. This is because sensitivity for detecting the magnetic field is dependent on the magnitude of the leak magnetic field, the magnetic field generating member of the probe 3, the spring constant and resonance frequency of the cantilever 4, and settings of an experiment system. The magnetic field characteristics evaluation apparatus shown in FIG. 15 has a function of measuring the image contrast change while adjusting the sensitivity of the probe. The sensitivity of the probe 3 is adjusted by the contrast controller 20. The contrast controller 20 refers to the intensity of the AFM signal obtained from the feedback circuit 112, and sets the frequency of the signal generator 6 to obtain an appropriate contrast in the signal processor 11.

The contrast controller 20 is useful, in case the magnetic field is excessively intense, the contrast change of the AFM signal tends to be saturated in the vicinity of the position with the magnetic field generated therein, and it is difficult to specify the magnetic field generation position. In this case, the frequency applied from the signal generator 6 is slightly changed from the resonance frequency. Alternatively, the sensitivity for detecting the magnetic field over the magnetic head 1 is reduced by increasing the amplitude of the vibrating signal. Reasons that the magnetic field detection sensitivity in this manner is reduced are that: (1) the cantilever 4 is vibrated at the frequency deviating from the resonance frequency of the cantilever 4 (the frequency that is small or large as compared with the resonance frequency), so a response of the cantilever 4 becomes slightly bad or (2) in case the vibrating amplitude is increased, the influence of the magnetic field on the probe 3 is reduced. For this, the frequency applied from the signal generator 6 or the amplitude is changed so that a desirable contrast is obtained in the contrast controller 20.

As a result, the embodiment of the present invention is characterized in that it is controlled whether or not the magnetic field generating member is magnetized, and a magnetic field generated from the magnetic field generating member is turned on or off. Thereby, measurement by an AFM and measurement by an MFM are implemented.

Moreover, the magnetic field generating member is not magnetized to obtain a state in which no magnetic field is generated over the magnetic field generating member. In case the measurement by the AFM is implemented under this state, an AFM signal does not undergo an influence by the magnetic field, and the surface configuration of the magnetic field generating member can accurately be measured.

Furthermore, under the state in which there is no magnetic field over the magnetic field generating member, the measurement by the AFM is enabled. Therefore, since the surface configuration of the magnetic field generating member can accurately be measured, a distance from the surface of the magnetic field generating member to the probe becomes constant, and a magnetic field distribution can also accurately be measured by the MFM.

After the measurement by the AFM in the non-magnetized state, all the surfaces of the magnetic head are scanned in a process for executing the measurement by the MFM in the magnetized state in a position in which the configuration of the magnetic head is defined by the AFM measurement.

Furthermore, the embodiment of the present invention is characterized in that the feedback signal of a point at which the magnetic field generating member is brought to the non-magnetized state (image indicative of a true surface configuration) is subtracted from the feedback signal of a point at which the magnetic field generating member is brought to the magnetized state. Thereby, the place in which the magnetic field is generated is specified.

Moreover, there is provided a function of controlling frequency of the vibrating means to change a contrast indicative of a magnetic field intensity of the position in which the magnetic field is generated.

Further, according to the magnetic field characteristics evaluation apparatus and characteristics evaluation method of the embodiment of the present invention, an AFM measurement error generated by the influence of the magnetic field is reduced. Therefore, the surface configuration of the magnetic field generating member can be obtained by the AFM, and the magnetic field distribution of the magnetic field generating member can be obtained by the MFM with a high precision and resolution.

Moreover, in case no current is passed through the magnetic head, the magnetic head can be placed in the non-magnetized state. In case the AFM measurement is executed under this state, the AFM signal undergoes no influence by the magnetic field, and the surface configuration of the magnetic head can accurately be measured.

Furthermore, the AFM measurement is possible under the non-magnetized state of the magnetic field generating member and the surface configuration of the magnetic field generating member can accurately be measured. Therefore, the distance to the probe from the surface of the magnetic field generating member becomes constant, and the magnetic field distribution can also accurately be measured by the MFM.

After such AFM measurement under the non-magnetized state of the magnetic field generating member, the surface of the magnetic field generating member is all scanned in the process of the MFM measurement under the magnetized state of the magnetic field generating member in the position where the configuration of the magnetic field generating member is defined. Therefore, the accurate surface configuration of the magnetic field generating member and the magnetic field distribution of the magnetic field generating member can be measured.

Furthermore, according to the magnetic field characteristics evaluation apparatus and measuring method of the embodiment of the present invention, the image information obtained by the AFM signal with the non-magnetized member is subtracted from the image information by the AFM signal with the magnetized member. Thereby, it is possible to specify the place in which the magnetic field is generated.

In case there are places with intense magnetic fields, such as the gap position of the magnetic head and the place with the leak magnetic field generated therein, the magnetic field information on the magnetic head as the magnetic field generating member can be measured by the AFM signal.

Moreover, the dependence in the current value and frequency of the current applied to the magnetic head can be measured by changing the respective values.

Furthermore, the desirable contrast of the magnetic field distribution can be obtained by changing the frequency or the amplitude applied from the signal generator.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic field characteristics evaluation apparatus comprising:

a setting device configured to selectively set a magnetic field generating member in one of a magnetized state in which a magnetic flux is generated and a non-magnetized state in which no magnetic flux is generated;

a probe, at least partially formed of magnetic material, configured to sense the magnetic field generating member during vibration of said probe;

a displacement detector configured to scan the magnetic field generating member with said probe vibrated and detect a first displacement of said probe in the non-magnetized state and a second displacement of said probe in the magnetized state;

a surface profile measuring circuit configured to measure a surface profile of the magnetic field generating member in the non-magnetized state based on the detected first displacement; and a magnetic distribution measuring circuit configured to separate said probe from the magnetic field generating member in the magnetized state by a constant distance based on the surface profile measured by said surface profile measuring circuit, and measure a magnetic distribution of the magnetic field generating member based on the detected second displacement.

2. The magnetic field characteristics evaluation apparatus according to claim 1, wherein said setting device comprising:

a signal source configured to generate a signal that is a source for magnetizing the magnetic field generating member;

a magnetizing signal generating circuit configured to magnetize the magnetic field generating member based on the signal, a processing signal that processes the signal, and a magnetization degree control signal that controls a degree of magnetizing the magnetic field generating member; and a switching device configured to turn on or off a switch in response to a switching signal that controls whether or not a magnetizing signal for magnetizing the magnetic field generating member is applied to the magnetic field generating member.

3. The magnetic field characteristics evaluation apparatus according to claim 2, wherein said setting device further includes a current value detector configured to detect a magnetizing current that magnetizes the magnetic field generating member, and output the magnetizing current as the magnetization degree control signal to said magnetizing signal generating circuit.

4. The magnetic field characteristics evaluation apparatus according to claim 1, wherein said setting device comprising:

a signal source configured to generate a signal that is a source for magnetizing the magnetic field generating member;

a magnetizing signal generating circuit configured to magnetize the magnetic field generating member based on the signal, a processing signal that processes the signal, and a magnetization current value control signal that controls a current value of magnetizing the magnetic field generating member; and a magnetization current value control signal generating circuit configured to generate the magnetization current value control signal based on comparison between a current value of the magnetic field generating member and a target value of the magnetization value.

5. The magnetic field characteristics evaluation apparatus according to claim 4, wherein said setting device further includes a current value detector configured to detect a magnetizing current that magnetizes the magnetic field generating member, and output the magnetizing current as the magnetization current value control signal to said magnetizing signal generating circuit.

6. The magnetic field characteristics evaluation apparatus according to claim 1, wherein said setting device includes a switching device configured to turn on or off a switch in response to a control signal that controls whether or not one or more magnetizing signals for defining a state in which the magnetic field generating member is magnetized are applied to the magnetic field generating member.

7. The magnetic field characteristics evaluation apparatus according to claim 6, wherein said setting device further includes a current value detector configured to detect a magnetizing current that magnetizes the magnetic field generating member, and output the magnetizing current as the magnetization current value control signal to a current monitor that monitors the magnetizing current.

8. A magnetic field characteristics evaluation apparatus comprising:

a setting device configured to selectively set a magnetic field generating member in one of a magnetized state in which a magnetic flux is generated and a non-magnetized state in which no magnetic flux is generated;

a probe, at least partially formed of magnetic material, configured to sense the magnetic field generating member during vibration of said probe;

a displacement detector configured to scan the magnetic field generating member with said probe vibrated and detect a first displacement of said probe in the non-magnetized state and a second displacement of said probe in the magnetized state;

a surface profile measuring circuit configured to measure two surface profiles of the magnetic field generating member in corresponding to the non-magnetized state and the magnetized state based on the detected first displacement and second displacement respectively; and calculating circuit configured to calculate a difference between the surface profile based on the detected first displacement and the surface profile based on the detected second displacement.

9. The magnetic field characteristics evaluation apparatus according to claim 8, further comprising a frequency amplitude control circuit configured to generate a frequency amplitude control signal that controls frequency and amplitude of said probe.

10. A magnetic field characteristics measuring method comprising:

setting a non-magnetized state in which no magnetic flux is generated from a magnetic field generating member;

scanning the magnetic field generating member with a probe, at least partially formed of magnetic material, that senses the magnetic field generating member during vibration of said probe;

detecting a first displacement of said probe;

measuring a surface profile of the magnetic field generating member in the non-magnetized state based on the detected first displacement;

setting a magnetized state in which the magnetic flux is generated from the magnetic field generating member;

separating said probe from the magnetic field generating member in the magnetized state by a constant distance based on the surface profile;

scanning the magnetic field generating member with said probe vibrated;

detecting a second displacement of said probe; and measuring a magnetic distribution of the magnetic field generating member based on the detected second displacement.

11. The magnetic field characteristics measuring method according to claim 10, wherein said setting step includes:

generating a signal that is a source for magnetizing the magnetic field generating member;

inputting and processing the signal, a processing signal that processes the signal, and a magnetization degree control signal that controls a degree of magnetizing the magnetic field generating member, and generating a magnetizing signal that magnetizes the magnetic field generating member; and turning on or off a switch in response to a switching signal that controls whether or not the magnetizing signal is applied to the magnetic field generating member.

12. The magnetic field characteristics measuring method according to claim 10, wherein said setting step includes:

generating a signal that is a source for magnetizing the magnetic field generating member;

inputting and processing the signal, a processing signal that processes the signal, and a magnetization current value control signal that controls a current value of magnetizing the magnetic field generating member, and generating a magnetizing signal that magnetizes the magnetic field generating member; and comparing between a current value of the magnetic field generating member, and a target value of the magnetization current value.

13. The magnetic field characteristics measuring method according to claim 10, wherein said setting step includes turning on or off a switch in response to a control signal that controls whether or not one or more magnetizing signals for defining a state in which the magnetic field generating member is magnetized are applied to the magnetic field generating member.

14. A magnetic field characteristics measuring method comprising:

setting a non-magnetized state in which no magnetic flux is generated from a magnetic field generating member;

scanning the magnetic field generating member with a probe, at least partially formed of magnetic material, that senses the magnetic field generating member during vibration of said probe;

detecting a first displacement of said probe;

measuring a first surface profile of the magnetic field generating member in the non-magnetized state based on the detected first displacement;

setting a magnetized state in which the magnetic flux is generated from the magnetic field generating member;

scanning the magnetic field generating member with said probe vibrated;

detecting a second displacement of said probe; and measuring a second surface profile of the magnetic field generating member in the magnetized state based on the detected second displacement; and calculating a difference between the first surface profile and the second surface profile.

15. The magnetic field characteristics measuring method according to claim 14, further comprises generating a frequency amplitude control signal that controls frequency and amplitude of said probe.

* * * * *